United States Patent
Adamic, Jr.

[19]

[11] Patent Number: 6,084,284

[45] Date of Patent: Jul. 4, 2000

[54] INTEGRATED CIRCUIT INCLUDING INVERTED DIELECTRIC ISOLATION

[76] Inventor: Fred W. Adamic, Jr., 866 Willow Glen Way, Santa Clara, Calif. 95125

[21] Appl. No.: 09/427,343

[22] Filed: Oct. 26, 1999

Related U.S. Application Data

[63] Continuation of application No. 09/016,745, Jan. 30, 1998, which is a continuation of application No. 08/711,376, Sep. 5, 1996, Pat. No. 5,841,197, which is a continuation of application No. 08/342,193, Nov. 18, 1994, abandoned.

[51] Int. Cl.[7] .............................. H01L 29/06; H01L 29/41
[52] U.S. Cl. ......................... 257/506; 257/508; 257/347; 257/773
[58] Field of Search ................................. 257/347, 506, 257/508, 773

[56] References Cited

U.S. PATENT DOCUMENTS

| | | |
|---|---|---|
| 5,402,989 | 4/1995 | Takasu . |
| 5,479,048 | 12/1995 | Yallup et al. ............................ 257/621 |
| 5,742,075 | 4/1998 | Burns et al. . |
| 5,889,302 | 3/1999 | Liu . |
| 5,936,280 | 8/1999 | Liu . |
| 5,939,755 | 8/1999 | Takeuchi et al. . |
| 5,942,781 | 8/1999 | Burr et al. . |
| 6,013,936 | 1/2000 | Colt, Jr. . |

*Primary Examiner*—George Fourson
*Attorney, Agent, or Firm*—Skjerven, Morrill, MacPherson, Franklin, & Friel, LLP; Ken J. Koestner

[57] ABSTRACT

A method of semiconductor fabrication includes the steps of forming a dielectric layer on a first surface of a semiconductor wafer having a plurality of laterally distributed semiconductor devices selectively interconnected on the first surface and bonding a support substrate to the first surface of the semiconductor wafer on the dielectric layer to form a composite structure. A portion of the semiconductor wafer from a second surface which is opposite the first surface is removed and the second surface of the semiconductor wafer is processed. Processing of the second surface optionally includes the formation of isolation trenches electrically isolating the laterally distributed semiconductor devices.

2 Claims, 15 Drawing Sheets

INTEGRATED CIRCUIT INCLUDING INVERTED DIELECTRIC ISOLATION

This is a Continuation Application from U.S. patent application Ser. No. 09/016,745, filed Jan. 30, 1998, which is a continuation of U.S. application Ser. No. 08/711,376, now U.S. Pat. No. 5,841,197, issued Nov. 24, 1998, which is a continuation of U.S. patent application Ser. No. 08/342,193, filed Nov. 18, 1994, now abandoned.

BACKGROUND OF THE INVENTION

1. Field of the Invention

The present invention relates to a semiconductor device and a method of manufacturing a semiconductor device and, more particularly, to a fabrication method for processing circuits on two opposing planar surfaces of a semiconductor wafer.

2. Description of the Related Art

A conventional integrated circuit generally includes a support substrate and an element layer formed upon the support substrate. The element layer includes various P-type and N-type doped regions which combine to form active transistor devices. Collector or drain terminals of vertical transistors are brought through buried silicon leadout regions to form ohmic contacts at the surface of the element layer. Electrical isolation between these devices is furnished by various forms of isolation barriers. Conventional techniques for forming collector or drain leadouts and isolation regions significantly decrease integrated circuit capabilities and greatly escalate circuit manufacturing costs.

Transistor performance characteristics are determined by the concentration of ions in the doped regions. For example, performance of vertical transistors is improved by reducing collector or drain leadout resistance since elevated resistance levels degrade output voltage swing and frequency response, waste energy through internal dissipation, and raise the temperature of the device thereby reducing reliability and capacity. To reduce the lateral component of collector or drain leadout resistance, a vertical transistor may incorporate a lightly doped collector or drain region overlying a more heavily doped same-type buried layer region. To reduce the vertical component of collector or drain leadout resistance, a heavily doped plug may be diffused into a surface region and buried beneath a surface collector or drain ohmic region.

Thus it is apparently desirable to reduce collector or drain lateral leadout resistance as much as possible by doping the buried layer very heavily. However, in a bipolar transistor for example, the maximum collector-to-emitter voltage is determined by the resistivity and thickness of the active collector region between the base and buried layer. Various high temperature processing steps subsequent to doping of the buried layer expands the buried layer by gas phase and solid state diffusion in proportion to the doping level. Heavy doping of the buried layer decreases the width of the active collector region, reducing transistor voltage capability. To increase the transistor voltage capability of a circuit, element layer thickness cannot be increased without limit because the costs of isolating circuit components becomes prohibitive and leadout resistance increases. Voltage and current capability of integrated vertical devices is thus constrained by these factors.

A strategy for reducing collector or drain leadout resistance is sought which does not require heavy doping of the buried layer or the usage of diffused plugs. In one exemplary process, two silicon wafers are bonded using high temperature bonding in which one of the wafers is previously etched and filled with a low resistivity metal or silicide to form a conductive layer. Numerous difficulties arise in the practice of this process. The silicon layer and conductive layer generally have mismatched thermal coefficients of expansion so that the sustained high temperatures to which the layers are subjected during bonding and subsequent processing cause stresses that result in junction leakage. In addition, the sustained high temperatures cause diffusion of metallic impurities, for example, from the conductive layer into the silicon layer, resulting in reduced minority carrier lifetime and junction leakage.

SUMMARY OF THE INVENTION

In accordance with a first embodiment of the present invention, a method of semiconductor fabrication includes the steps of forming a dielectric passivating layer on a first surface of a semiconductor wafer having a plurality of laterally distributed semiconductor devices selectively interconnected on the first surface and bonding a support substrate to the first surface of the semiconductor wafer on the passivating layer to form a composite structure. A portion of the semiconductor wafer from a second surface which is opposite the first surface is removed and the second surface of the semiconductor wafer is processed. Processing of the second surface optionally includes the formation of isolation trenches electrically isolating the laterally distributed semiconductor devices.

Numerous advantages are attained by practicing the disclosed process in the fabrication of integrated circuits and discrete devices. The formation of a passivating layer on the surface of a semiconductor wafer having a plurality of interconnected semiconductor device elements makes possible the fabrication of integrated circuits and devices in which a conventional-type front surface is made internal to the semiconductor device and hermetically sealed for improved reliability.

The formation of a composite structure by bonding of a support substrate to the semiconductor wafer at the intermediate passivating layer furnishes discrete devices and integrated circuits in which the support substrate is either electrically isolated from active and passive device elements or connected internally to a terminal of a device element. For power integrated circuits, the materials for forming the internal dielectric layers are selected to have high thermal conductivity to enhance power performance. Furthermore, the support substrate material is selected to provide devices and integrated circuits having a support substrate that is optimized for electrical and thermal conductivity. In addition the bond layer is optionally formed to supply circuits in which the intermediate bond layer is utilized as a patterned electrical interconnect.

In some embodiments, the support substrate, the bond layer or both are patterned to form empty channels for circulating cooling gases or liquids through the circuit.

By removing a portion of the semiconductor wafer backside surface and processing this surface of the composite wafer, additional semiconductor circuit capabilities are enabled. Discrete devices and integrated circuits are fabricated which have a reduced leadout resistance by incorporating a conductive layer in close proximity to an active collector or drain region.

In integrated circuit embodiments, the collector or drain contact region surface area of a conventional circuit is eliminated by utilizing the conductive layer as a bonding pad, thereby avoiding the lateral and vertical leadout resistance inherent in such a structure.

In other integrated circuit embodiments having conventional collector or drain connections and an isolation trench on the backside surface of the substrate for separating active device elements, lateral and vertical leadout resistance is reduced by incorporating a conductive layer connected in close proximity to the active collector or drain region, to isolation trench sidewalls, and to the frontside metal interconnect layer. Some examples of circuits in accordance with this embodiment include device elements which are selectively interconnected on the backside surface.

The removal of a portion of the semiconductor wafer backside surface and the processing of this surface of the composite wafer furnishes several advantageous conditions for semiconductor fabrication. Devices are constructed in which ohmic contact is made in close proximity to an active collector or drain region of a device element by the creation of heavily doped regions in the element backside while maintaining the element front surface at a low temperature. Other devices are constructed in which an active junction is made in the exposed backside of a device element by selective doping while a low temperature is maintained at the frontside surface of the element. The disclosed process makes possible the construction of various novel vertical device structures.

Further advantages accrue from the combination of steps of the semiconductor fabrication method. The method is used to construct integrated circuits having individual device elements which are isolated by dielectric layers and trenches lined with dielectric materials. Integrated circuits are fabricated which incorporate improvements in density, isolation, and reliability, with lower collector or drain resistance, and an improved high voltage and high current operating capability.

DESCRIPTION OF THE DRAWINGS

In the figures, drawings are illustrative and not drawn to scale so that relative layer thicknesses of actual structures are not represented. Like reference characters indicate like parts, as follows.

DETAILED DESCRIPTION

Figure 1:
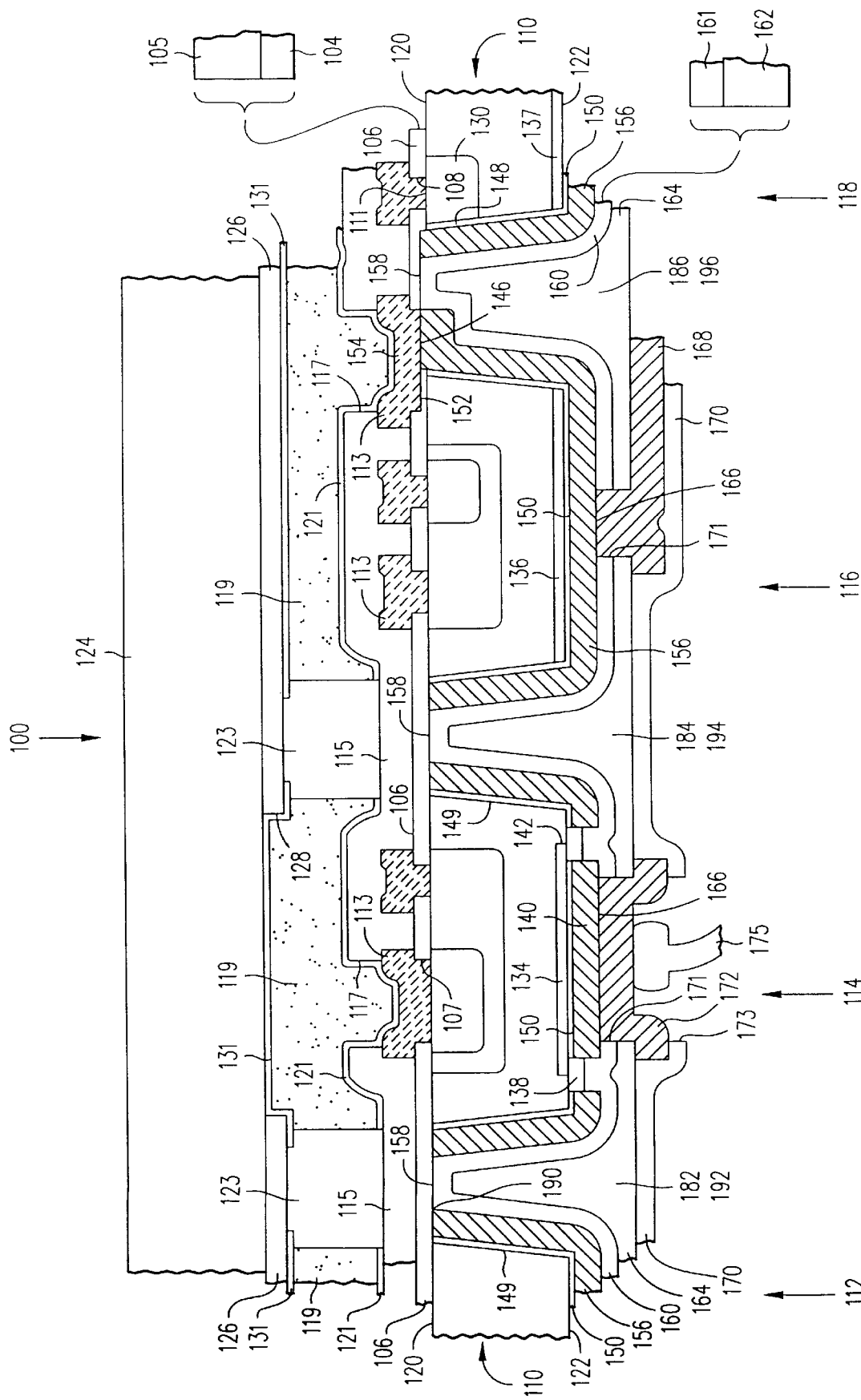
FIG. 1 is a schematic cross-sectional view of a portion of a semiconductor circuit in accordance with a first embodiment of the present invention.

FIG. 1 illustrates a cross-sectional view of a portion of a semiconductor circuit 100. Four semiconductor devices 112, 114, 116 and 118 are included in an element layer 110 in this portion of the semiconductor circuit 100. The four semiconductor devices 112, 114, 116 and 118 arbitrarily represent various types of active and passive semiconductor devices including, for example, NPN and PNP bipolar devices, N-channel and P-channel MOS devices, junction FETs, diodes, and various four-layer devices such as silicon controlled rectifiers (SCRs). Element layer 110 is constructed in a conventional manner, such as the application of an epitaxial process to a silicon wafer (not shown) to form the element layer 110 having a first or frontside surface 120 and a second or backside surface 122. Ion implantation and diffusion processes are variously applied to element layer 110 so that, for example, doped regions, such as frontside diffusion region 130, are established to form junctions and furnish ohmic contact regions. Similarly, in some embodiments doped regions are generated near the backside surface 122 of element layer 110, for example, to reduce collector or drain leadout resistance, or to form junctions or ohmic contact regions. These regions (not shown) are buried using conventional buried-layer processing techniques and exposed by removal of a portion of the semiconductor wafer backside surface 122. Various active and passive semiconductor devices are subsequently constructed using conventional methods which are applied in the vicinity of the frontside surface 120 of element layer 110 to generate conventional semiconductor device structures.

In addition to conventional methods, the illustrative semiconductor fabrication process involves removing a portion of the wafer to expose the backside surface 122 of the active device element layer 110 of an active element to additional processing, allowing construction of advantageous structures. For example, shallow doping is applied to the exposed backside surface 122 of element layer 110 to create an opposite-type (N-P) active region 134 in semiconductor device 114 and a same-type (N—N or P—P) ohmic region 136 in semiconductor device 116.

A spacer layer 138 of a dielectric material, such as silicon oxide (silicon dioxide or silicon monoxide) is selectively patterned on backside surface 122 of element layer 110 for multiple purposes. For example, spacer layer 138 protects a surface junction 142 between opposite-type active region 134 and element layer 110 that is formed on the backside surface 122 of semiconductor device 114. In addition, spacer layer 138 serves as a mask which prevents formation of self-aligned silicide or selective metal depositions. In this manner, spacer layer 138 isolates adjacent metallized regions on the backside of individual semiconductor device elements.

Multiple grooves 182, 184 and 186 partition element layer 110. Grooves 182, 184 and 186 serve as isolation trenches 192, 194 and 196, respectively, which electrically isolate semiconductor devices 112, 114, 116 and 118. Groove 186 also furnishes access to a metal interconnect, such as a frontside metal layer pad 154 on frontside surface 120 through a via region 146.

Low-resistance silicide layer 150 and selectively deposited conductive layer 156 cover the backside surface 122 and sidewalls 148 and 149 of semiconductor devices 112, 114, 116 and 118. Silicide layer 150 and conductive layer 156 are patterned to expose backside surface 122 in all regions other than those regions at which spacer layer 138 is formed and at the foot 158 of isolation trenches 182, 184 and 186, where a frontside dielectric layer 106 overlying frontside surface 120 is exposed. Spacer layer 138 and dielectric layer 106 serve as a mask for patterning silicide layer 150 and conductive layer 156. Therefore, in combination silicide layer 150 and conductive layer 156 form a self-aligned structure which isolates selected regions of the element layer 110 as determined by the placement of the spacer layer 138 and dielectric layer 106. As an alternative to a self-aligned fabrication process, silicide layer 150 and conductive layer 156 may also be formed using conventional lithography techniques as applied to deposited metal layers.

Silicide layer 150 forms an ohmic junction with doped backside regions 134 and 136 and with a sidewall region 148 where isolation trench 196 intersects frontside diffusion 130 in a region having a high dopant concentration.

Metal layer 156 forms a low resistance contact with silicide layer 150 and with frontside interconnect metallization layer 113 in via region 146 which is formed in a thinned region 152 of dielectric layer 106. In the vicinity of semiconductor device 114, metal layer 156 furnishes a backside electrical connection 140 for electrically connecting the backside surface 122 of semiconductor device 114 to a bonding pad 172 formed in backside metallization layer 168. Bonding pad 172 provides direct electrical connection to active region 134.

For semiconductor device 116, conductive layer 156 furnishes a direct electrical connection between collector or drain ohmic region 136, frontside metallization layer 113 and backside interconnect metallization layer 168. In device 118, conductive layer 156 furnishes a direct electrical connection between collector or drain ohmic region 137 and frontside ohmic region 130.

A backside junction seal dielectric layer 160 covers the metal layer 156 overlying the backside surface 122 and trench sidewalls 149 of the semiconductor devices 112, 114, 116 and 118 to furnish electrical isolation of the individual semiconductor devices. In addition, backside junction seal dielectric layer 160 covers the foot 158 of the isolation trenches 192, 194 and 196, thereby forming a junction seal 190 at the element layer 110 frontside surface 120. Backside junction seal dielectric layer 160 includes a silicon oxide layer 161 overlying the metal layer 156 and a dielectric layer 162 covering the silicon oxide layer 161. The silicon oxide layer 161, which contains phosphorous oxide to attract and capture mobile ions, serves as a getter. The dielectric layer 162 is formed from a material such as silicon nitride, which is resistant to the penetration of ionic contaminants. A planarizing dielectric layer 164 fills the isolation trenches 192, 194 and 196 and covers the backside surface 122 of the element layer 110, thereby planarizing the surface 122. The planarizing dielectric layer 164 is composed of a dielectric material such as a spin-on glass or a polyamide formulation. Planarizing dielectric layer 164 and backside junction seal dielectric layer 160 are selectively patterned and etched and an interconnect metallization layer 168 is extended through thee resulting aperture 171 so that a bonding pad 172 and electrical contact 166 furnish electrical access to the backside surface 122 of semiconductor devices 114 and 116, respectively. A backside dielectric passivation layer 170 covers the backside surface 122 of element layer 110, overlying the planarizing dielectric layer 164. Backside dielectric passivation layer 170 is patterned to open an aperture 173 over bonding pad 172, which allows the attachment of bonding wire 175.

On the frontside surface 120 of element layer 110, semiconductor devices 112, 114, 116 and 118 are covered by a frontside dielectric layer 106 which includes a silicon oxide layer 104 and a dielectric layer 105. Frontside dielectric layer 106 protects the junctions between doped regions at the frontside surface 120 of element layer 110. Multiple apertures 107 perforate frontside dielectric layer 106 for various purposes. For example, a contact opening 108 overlies the frontside surface 120 of semiconductor device 118 and an ohmic contact 111 extends through the contact opening 108 to access frontside diffusion 130. A patterned frontside interconnect metallization layer 113 is disposed within metallization aperture 107 and furnishes electrical access to semiconductor device 114. In other embodiments, several layers of metallization may be separated by interlayer dielectric layers. Thinned regions 152 of frontside oxide layer 104, which are uncovered during isolation trench etching, are further etched to bare the undersides of frontside metal layer pads 154.

A frontside passivation layer 115 overlies the frontside dielectric layer 106 and has passivation openings 117 for electrically connecting the metallization layer 113 to an overlying bond layer 119. Dielectric layer 105 and the dielectric layers overlying the frontside dielectric layer 106, including the frontside passivation layer 115, are optionally constructed principally from materials with high thermal conductivity and resistance to the penetration of mobile ions.

Bond layer 119 is formed from a bonding material, composed principally of metal, which flows and sinters at a low temperature and has a high thermal and electrical conductivity. The bonding material flows to form a void-free conformal bond with the irregular surface of the element layer 110 and the overlying layers on the frontside surface 120. It is advantageous for the bonding material to have a higher softening temperature upon reheating after formation. For such a bonding material, a low bonding temperature minimizes internal stress during formation but after bonding the material is able to tolerate the higher temperatures of subsequent processes without softening or losing adherence. In some embodiments, a bonding material is appropriate that has a high thermal conductivity alone and thus may be constructed principally of a thermally conductive ceramic or other material. Bond layer 119 is patterned for various purposes. For example, a pattern gap 123 electrically and thermally isolates device 114 and forms device interconnects for devices 114 and 116. In addition, gap 123 supplies thermal coolant channels (not shown) through which cooling gases or liquids are circulated and furnishes stress isolation for selected devices of circuit 100. Also, thermal expansion gaps (not shown) are formed in the bond layer by a pattern-gapping process to account for differences in temperature coefficient of expansion.

A bond interface metal layer 121 overlies the frontside passivation layer 115, between the passivation layer 115 and the bond layer 119. The bond interface metal layer 121 is constructed from a material or materials with high electrical and thermal conductivity. This material adheres well to adjacent surfaces and furnishes a low contact resistance between interconnect layer 113 and bond layer 119.

Furthermore, this material forms a barrier which prevents reactions between bond layer 119 and interconnect layer 113. In some embodiments, the bond interface metal layer 121 is etched using the bond layer as the mask to form a self-aligned structure.

A support substrate 124 overlies the bond layer 119. The support substrate 124 is selected from a material having suitable thermal and electrical conductive properties. However, the support substrate 124 is generally constructed from silicon to match the temperature coefficient of expansion of element layer 110. Furthermore, doped silicon has suitably high thermal and electrical conductivity. Silicon also advantageously facilitates formation of an ohmic contact and is easily micromachined to form through-hole and surface channels (not shown) through which liquids and gases are circulated to cool packaged devices.

The support substrate 124 is optionally electrically isolated from the bond layer 119 by a dielectric layer 126, which optionally is constructed principally from a material with high thermal conductivity.

An aperture 128 in dielectric layer 126 furnishes an electrical connection between a portion of the bond layer 119 and the support substrate 124. Thus, the illustrative method furnishes a process in which support substrate 124 is selectively isolated from an active or passive device or connected internally to any terminal connecting to a device. Such a connection is useful for various purposes. For example, an aperture 128 is useful in a power transistor in which bond layer 119 is also used as a circuit interconnect. In this application, support substrate 124 and element layer 110 are aligned before bonding. A bond interface layer 131 overlies the support substrate dielectric layer 126, between the dielectric layer 126 and the bond layer 119. The bond interface layer 131, like the bond interface metal layer 121, is constructed from a material with high electrical and thermal conductivity, and good adhesion capability between adjacent surfaces. Similarly, this material promotes a low contact resistance between support substrate 124 and bond layer 119, and serves as a barrier to prevent reactions between bond layer 119 and support substrate 124. Bond interface layer 131 is patterned to accommodate bond layer gaps 123.

The illustrative semiconductor circuit 100 furnishes an integrated circuit in which the lateral and vertical leadout resistance of semiconductor devices is reduced by a conductive layer connected in close proximity to the active collector or drain.

In accordance with the illustrative method, semiconductor circuits are fabricated to achieve particular selected characteristics by electrically isolating various circuit elements and regions, selectively doping semiconductor regions and selectively placing metallization with respect to semiconductor regions. For example, in high performance analog integrated circuits, advantageous operating properties are achieved when vertical NPN and PNP bipolar devices have similar (complimentary) operating characteristics. Further advantages are attained when such devices can be scaled to larger sizes so that large output currents are generated and collector resistance is held low. FIGS. 2(a) through 2(f) are process sectional views showing a semiconductor wafer 202 at various sequential stages in fabrication of a bipolar device circuit 200 which furnishes devices including an NPN transistor 212 and a PNP transistor 214 having mutually similar operating characteristics and scalable sizes. In this process, a PNP transistor 214 is formed in lightly doped P-type regions of semiconductor wafer 202. These lightly doped P-type regions are diffused into an N-type element layer 210. An NPN transistor 212 is formed in the N-type element layer. FIGS. 2(a) through 2(f) are not drawn to scale. The size of features is exaggerated to depict circuit details more clearly. Many of the fabrication processes are well known and commonly utilized in conventional planar wafer processing.

Figure 2A:
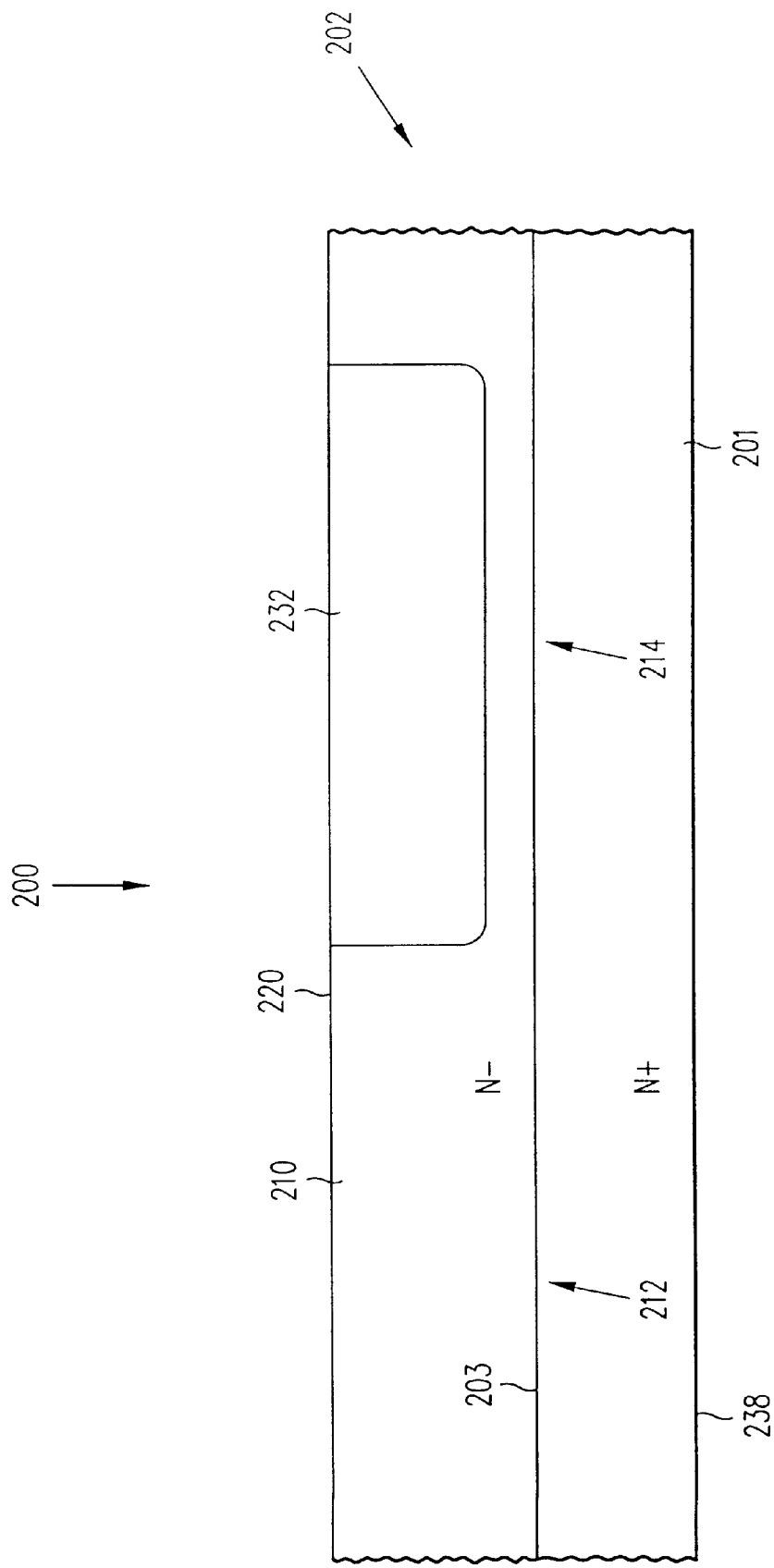
FIGS. 2(a)–2(f) are process sectional views showing an embodiment of a method for manufacturing a bipolar semiconductor circuit in accordance with the present invention.

FIG. 2(a) shows a low resistivity N-type silicon wafer 201 which has <100> orientation and is doped with an N-type impurity such as antimony or arsenic. The <100> orientation is selected to furnish compatibility with anisotropic etch solutions. A low concentration N-type element layer 210 is deposited onto surface 203 of silicon wafer 201 by epitaxy. For subsequent processing of silicon wafer 201, specifically an electrochemical etching process which removes a substantial portion of silicon wafer 201, wafer conductivity is limited to a maximum of approximately 0.01 ohm-cm.

A low concentration P-type collector region 232 is formed in element layer 210 in a two-step process in which a P-type dopant such as aluminum or boron is implanted into frontside surface 220 followed by diffusion of P-type ions into collector region 232. Diffusion of P-type ions into collector region 232, in combination with subsequent high temperature processing operations, causes the P-type ions of collector region 232 to penetrate the high resistivity element layer 210. Aluminum diffuses more readily than boron, reducing the diffusion time of P-type ions and thereby resulting in less outdiffusion of N-type ions from silicon wafer 201 into element layer 210 and improved control of element layer 210 thickness. Thus, aluminum is a preferred dopant for doping a thick layer. The first ions diffused into semiconductor wafer 202 are applied to diffuse into regions at the deepest level of element layer 210, farthest removed from the frontside surface 220 toward backside surface 238.

Deep doping of the element layer 210 is performed to achieve various performance goals. For example, the concentration of dopant ions in collector region 232 is controlled so that collector resistivities in the active collector regions of PNP transistors and the active collector regions of NPN transistors support the same voltage in selected regions of element layer 210.

In other examples, deep doping of the element layer 210 is used to reduce collector readout resistance by diffusing heavily doped collector plug regions.

In some process embodiments, conventional buried layer diffusions under element layer 210 are employed to form ohmic contacts with backside metal or silicide and to form active junctions of opposite types. However, such ohmic contacts and active junctions are also formed by removing a portion of the semiconductor wafer backside surface and processing this surface of the composite wafer in accordance with various method embodiments described herein. Furthermore, such ohmic contacts and active junctions are also formed by a combination of deep doping and backside processing to achieve various localized concentrations of impurity ions.

Figure 2B:
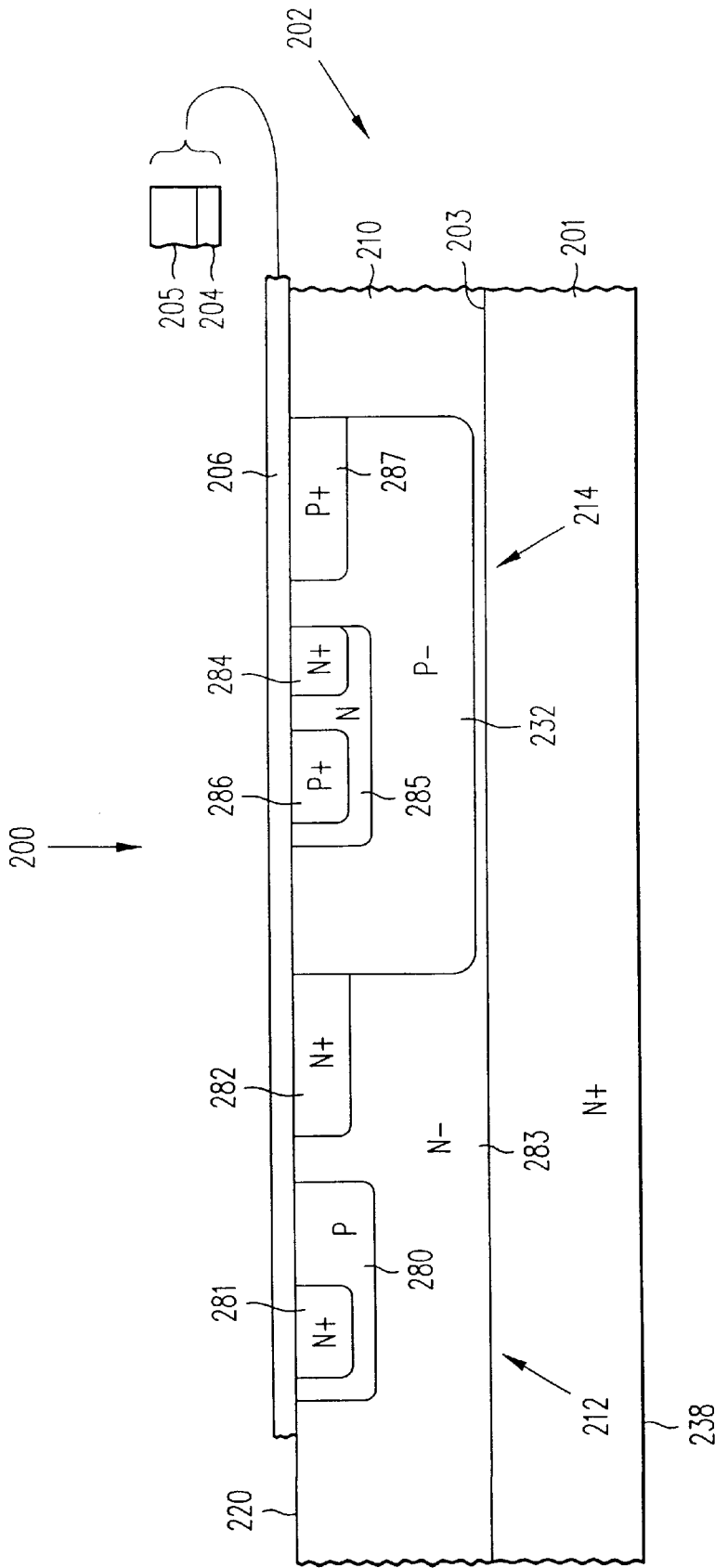

Referring to FIG. 2(b), integrated circuit devices are formed in and on the frontside surface 220 of element layer 210. In particular, two sets of doped regions including (1) a base region 280 and an emitter region 281 of NPN transistor 212 and (2) a base region 285 and an emitter region 286 of PNP transistor 214, are formed in element layer 210 utilizing a diffusion process. The emitter diffusions also form ohmic contacts including NPN transistor 212 collector ohmic contact region 282 and PNP transistor 214 collector ohmic contact region 287, and PNP base ohmic contact region 284.

These ion diffusions create a thin layer of thermally grown silicon oxide 204 which covers frontside surface 220 of element layer 210. The silicon oxide layer 204 overlies and protects the P-N junctions at surface 220. The protection of the P-N junctions is further augmented by deposition of a silicon nitride layer 205 which overlies silicon oxide layer 204. Silicon nitride is a useful dielectric material which serves as an effective mobile ion barrier.

The silicon nitride layer 205 and silicon oxide layer 204, in combination, form a protective frontside dielectric layer 206 which protects frontside surface 220 from ionic contamination and supplies electrical insulation. Formation of frontside dielectric layer 206 and subsequent processing creates a semiconductor structure in which the element layer 210 frontside surface 220 is made internal to the device and hermetically sealed for improved reliability. Part of the thickness of thin silicon oxide layer 204 is formed in frontside dielectric layer 206 to be subsequently removed to furnish a via connection (see bonding pad via connection 272 shown in FIG. 2(f)) between metal layers (see metal pad 254 shown in FIG. 2(f)) on the front and back sides of the element layer 210. Frontside dielectric layer 206 is selectively patterned to furnish an insulating layer and electrical contacts on frontside surface 220 so that FIGS. 2(b) through 2(f) do not necessarily reflect the actual contour of dielectric layer 206. The illustrative bipolar device circuit 200 exemplifies an integrated circuit in which the lateral and vertical leadout resistance of semiconductor devices 212 and 214 is reduced by selectively incorporating a conductive layer in close proximity to active collector regions and connected to diffused frontside collector ohmic regions. Furthermore, the bipolar device circuit 200 illustrates an integrated circuit in which a collector contact region of semiconductor device 218 is replaced by a bonding pad 257 forming a direct metal connection in close proximity to the active collector of the device, as is shown in FIG. 2(f). The conventional collector leadout resistance and the collector contact region surface area are thereby eliminated.

Figure 2C:
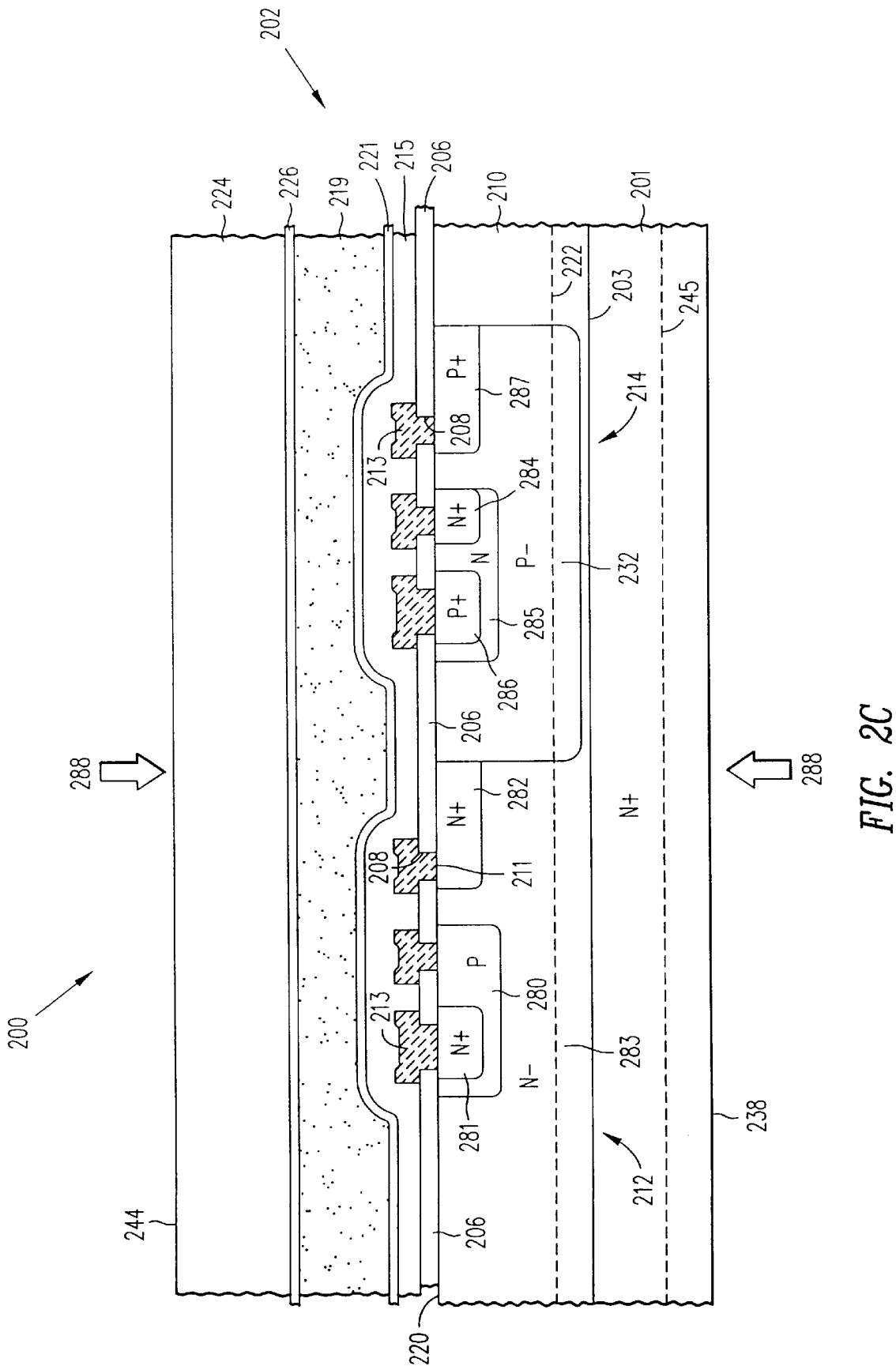

Referring to FIG. 2(c), contact openings 208 are formed in frontside dielectric layer 206 to construct interconnects in frontside surface 220 of element layer 210 so that the various doped elements within element layer 210 are precisely aligned to the frontside dielectric layer 206. A frontside interconnect metallization layer 213 is deposited and patterned to furnish a patterned metal contact and interconnect between element layer 210 and devices outside bipolar device circuit 200. Frontside interconnect metallization layer 213 is constructed principally of aluminum which, upon heating, forms frontside ohmic contact regions 211 with frontside diffusions including base region 280, emitter region 281 and collector ohmic contact region 282 of NPN transistor 212, and base ohmic region 284, emitter region 286 and collector ohmic contact region 287 of PNP transistor 214, which are exposed at contact openings 208. A layer of dielectric material made principally of silicon nitride, is deposited to form frontside passivation layer 215. A laminated bond interface metal layer 221, composed of titanium, nickel and silver (Ti—Ni—Ag), is deposited onto the surface of frontside passivation layer 215 to adhere frontside passivation layer 215 to an overlying bond layer 219. The titanium layer of interface layer 221 adheres to passivation layer 215 and forms an electrical contact with interconnect layer 213, while the top silver layer adheres and forms an electrical contact to bond layer 219. The middle nickel layer of bond interface layer 221 is a metallurgical barrier which prevents interaction of components of the bond layer 219 with the titanium layer, passivation layer 215 or interconnect layer 213. The titanium, nickel and silver (Ti—Ni—Ag) composition of the laminated bond interface metal layer 221 is typical for interfacing of power devices to solder, although other materials, as are known in the art of semiconductor devices, may be utilized.

Bond layer 219 is formed by the deposition and patterning of a bonding material that flows and sinters at a low temperature. Bond layer 219 is generally applied using silk screen or stencil printing techniques. For example, bond layer 219 is patterned by aligning a thick-film screen mask (not shown) to the impression of frontside interconnect metallization layer 213. A bonding material composed principally of glass and metal powders in an organic medium is silk screened onto the uneven surface of semiconductor wafer 202 to coat the wafer in conformance with the surface shape, forming a patterned bond layer 219 that flattens the surface to a level form. Note that, in its wet state the bond layer 219 is firm and forms a level surface. After solvent burn-off, the bond layer 219 remains firm but is reduced in size. At this time, the silver powder within bond layer 219 is not yet sintered (physically connected). A bonding process is applied, at a higher temperature than burn-off, and the bond layer 219 flows to fill irregularities in the surfaces of the wafer and substrate. The silver powder sinters to form the final flattened structure. Application of silver-glass for attaching dice to package substrates is discussed in "Low Stress Silver-Glass Die Attach Material," M. N. Nguyen, IEEE Transactions on Components, Hybrids, and Manufacturing Technology, September, 1990, pp. 478–483. Semiconductor wafer 202 is heated to less than approximately 300° C., repelling volatile organic components from the bonding material to form a firm bond layer 219 which is typically greater than approximately 15 microns thick and having a composition of greater than approximately 80% silver by weight.

An alternative deposition method employs a patterned stencil, such as a photoresist pattern for example, which is formed on bond interface layer 221 with walls that define isolation gaps (not shown) in bond layer 219 and which also precisely define the thickness of bond layer 219. A silver-glass material is applied level to the tops of the stencil walls using a wiper arm. The silver-glass material is then dried. Photoresist walls are then easily removed using organic solvents or plasma cleaning.

The bonding material which is used to form bond layer 219 is selected from metals, alloys, ceramics, organic adhesives, glasses and other materials according to desired thermal and electrical conductivity characteristics. In some applications, including the application of the embodiment shown in FIGS. 2(a)–2(f), a high thermal and electrical conductivity of bond layer 219 is sought. In this case, bond layer 219 is constructed principally of metal, however other applications may seek only a high thermal conductivity. For such an application, bond layer 219 is constructed principally of a thermally conductive ceramic or other material.

Bond layer 219 is a versatile structure which is modified in various manners to achieve diverse design objectives. For example, bond layer 219 may be patterned to furnish pattern gaps 123 shown in FIG. 1. A pattern gap is useful as a patterned device electrical interconnect, as an insulator to thermally isolate portions of a semiconductor wafer, as a barrier to furnish stress isolation of circuit components, or as a conduit for directing cooling gasses or liquids to selected regions of the circuit 200.

A support substrate 224 is chosen from among semiconductor materials which are doped sufficiently to form an ohmic contact. Advantages are attained when the temperature coefficient of expansion of support substrate 224 is matched to that of silicon wafer 201. This is achieved when the composition of support substrate 224 is substantially the same as that of silicon wafer 201. Furthermore, support substrate 224 is selected to attain a desired thermal and electrical conductivity. Silicon is a useful material for constructing a support substrate by virtue of a high thermal conductivity and high electrical conductivity when doped. The illustrative method constructs integrated circuit and discrete devices in which support substrate 224 materials are selected for improved electrical and thermal conductivity characteristics. Ohmic contact is easily made to silicon and silicon can be micromachined to furnish channels for circulating liquids and gases to cool packaged devices. Support substrate 224 is optionally electrically connected to bond layer 219 by depositing a bond interface metal layer 226 that may consist principally of a material with high electrical and thermal conductivity, for example a laminated layer of titanium-nickel-silver (Ti—Ni—Ag). The titanium layer of the titanium-nickel-silver laminated layer forms an ohmic contact to support substrate 224.

Support substrate 224 is positioned in a fixture (not shown) with the silver surface of metal layer 226 in contact with the surface of silver-glass bond layer 219. A controlled mechanical pressure 288 is applied to the surfaces of support substrate 224 and silicon wafer 201 that are opposite the contact between metal layer 226 and bond layer 219 so that the surfaces are brought into intimate contact. The combined semiconductor wafer 202 assembly is heated to a temperature in the range of approximately 300° C. to 450° C. At this temperature, the silver-glass material of bond layer 219 softens sufficiently to form a void-free conformal bond layer 219 which smoothes variations in the semiconductor wafer 202 surface and reduces surface and thickness nonuniformities in silicon wafer 201 and support substrate 224. At this temperature sintering occurs so that silver flakes (not shown) in bond layer 219 sinter together in combination with silver layers of bond interface layers 221 and 226. The bond layer 219 resulting from this sintering operation has a resistivity of less than approximately 15 microhms-cm and thermal conductivity greater than approximately 0.80 watts/cm-° C. Prior to bonding, opposing surfaces 238 of silicon wafer 201 and 244 of support substrate 224 are optionally polished to a sufficient flatness and thickness uniformity.

Surface 238 of silicon wafer 201 is removed by a grinding process to within about 35 microns of surface 203, forming a temporary surface 245. The combined semiconductor wafer 202 structure is then mounted in an etch fixture (not shown) which protects and makes electrical contact to surface 244 of support substrate 224. The fixture is then immersed in a stirred bath (not shown) containing a dilute aqueous bath of typically less than 10% by volume of hydrofluoric acid. A positive voltage is applied to support substrate 224, relative to the potential of a platinum electrode (not shown) in the bath in close and uniform proximity to temporary surface 245. Electrical current flows to temporary surface 245 through support substrate 224, bond layer 219, passivation openings 217 (see FIG. 2(f)) in frontside passivation layer 215, to interconnect metallization layer 213 and to special N-type ohmic contacts (not shown) in element layer 210 located to provide uniform current density across the wafer. Passivation openings 217 are etched into frontside passivation layer 215 to electrically connect bond layer 219 to interconnect metallization layer 213. The remaining thickness of heavily doped silicon wafer 201 is electrochemically etched in which etching is terminated when lightly doped element layer 210 is uncovered at interface surface 203. Etching current is maintained until all of silicon wafer 201 is removed, thus creating temporary surface 203. Chemical-mechanical polishing is performed on surface 203 to precisely remove etch residues (not shown) and the portion of element layer 210 containing the updiffused region that results from the heavy doping of silicon wafer 201, thus creating backside surface 222. This technique of sculpting the backside of a semiconductor wafer is discussed further in U.S. Pat. No. 4,554,059 "Electrochemical Dielectric Isolation Method," issued to J. P. Short et al. on Nov. 19, 1985.

Figure 2D:
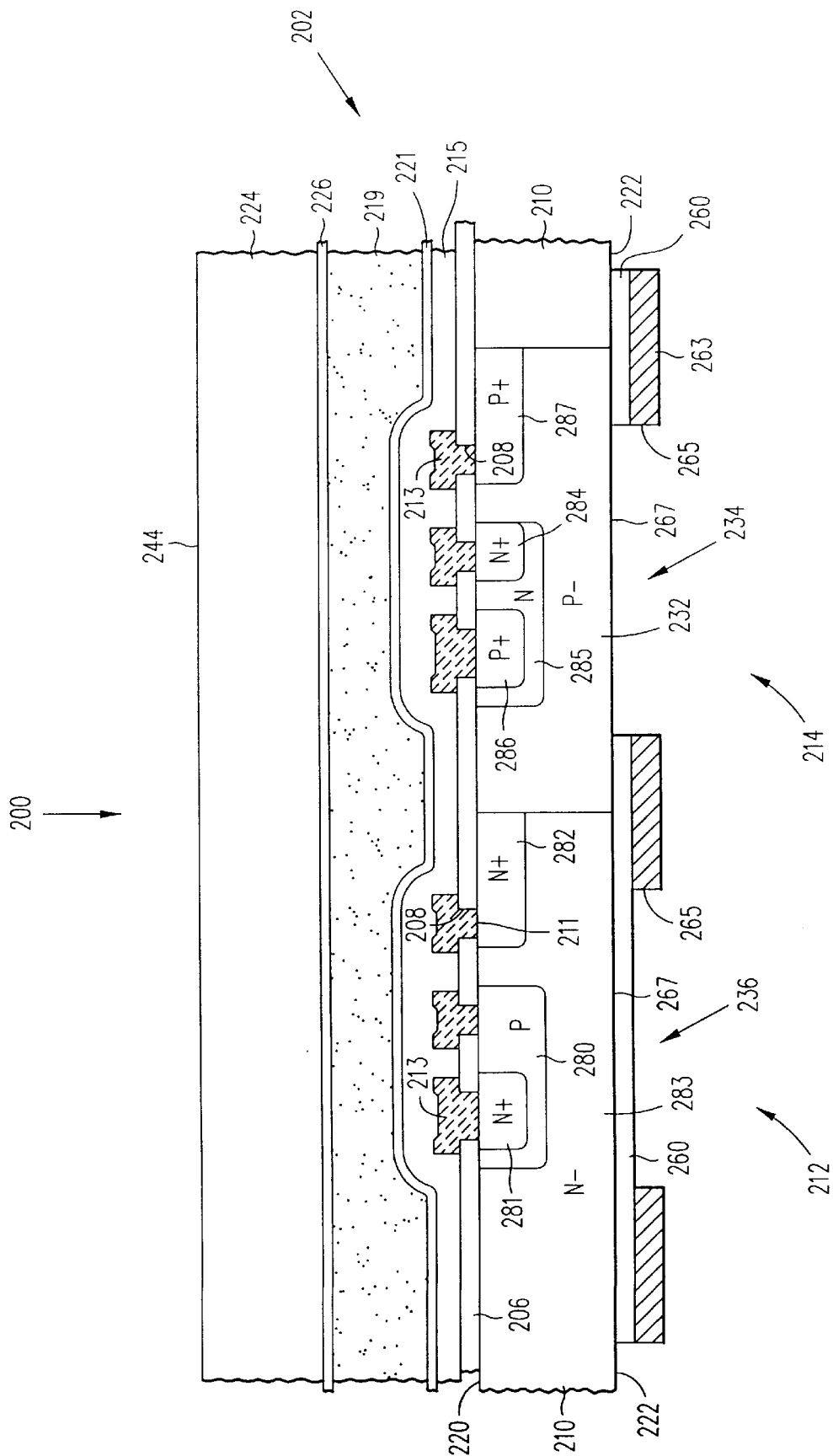

Silicon wafer 201 and a substantial portion of element layer 210 are precisely removed to expose the backside surface 222 of element layer 210. This process includes coarsely grinding or etching the bulk of semiconductor wafer 201, and precisely or finely etching the remaining portion of semiconductor wafer 201 using a concentration-dependent electrochemical etching process and by precise chemical-mechanical polishing of element layer 210. Referring to FIG. 2(d), an oxide layer and a reflective metal layer are deposited, a composite doping mask is applied and regions in the metal layer are opened to the oxide where various dopants are applied at selected concentrations. Specifically, oxide layer 261 is deposited on backside surface 222. A reflective metal layer 263, for example an aluminum layer 263, is deposited and apertures 265 are etched into aluminum layer 263 where ohmic contacts 267 are subsequently formed in regions (236 and 234). Oversize masks and deposited layers (not shown) are used to open or protect various regions. Oxide layer 261 is shown protecting NPN collector region 236 while PNP collector region 234 is doped with P-type ions by boron implantation. Region 236 is similarly doped with N-type ions using arsenic or phosphorous implantation. Dopant ions are activated and diffused into regions 236 and 234 using eximer laser heating of backside surface 222. Eximer laser radiation propagates through oxide and is completely absorbed by the silicon surface where temperatures sufficient even to melt silicon can instantaneously be achieved. In regions protected from doping the laser energy is reflected by the metal mask. During exposure of backside surface 222 to eximer laser heating, the duty cycle of the laser is controlled and the substrate is cooled to keep the temperature of frontside surface 220 contact regions below approximately 450° C. In various embodiments, the doping process may include processes such as gas immersion laser doping or glass source doping. During this heating process, the silicon surface is heated from a source such as eximer laser radiation. A description of gas immersion laser doping is found in "Low Temperature Fabrication of P+-N Diodes with 300-Junction Depth," K. H. Weiner, P. G. Carey, A. M. McCarthy, and T. W. Sigmoh, IEEE Electron Device Letters, July, 1992, pp. 369–371.

In this manner, shallow doping of the exposed element layer 210 silicon surface 222 creates same-type ohmic regions 234 and 236. Opposite-type regions may alternatively be formed to construct, for example, four-layer devices, such as silicon-controlled rectifiers (SCRs). However, in other embodiments dopant regions may be formed as buried layers rather than formed using a shallow doping process. For example, ohmic contacts may be formed in N-type regions with a minimum doping of greater than approximately $1\times10^{19}$ $cm^{-3}$ while P-type regions require a minimum doping of only greater than approximately $1\times10^{16}$ $cm^{-}$.

A mask which is used to form various backside regions, such as ohmic regions 234 and 236, must be aligned to appropriate frontside structures. This is problematic since the mask must be aligned to a wafer that has no existing visible pattern. One method for aligning a mask utilizes the differential etch rate of an etchant as the etchant is applied to both P-type and N-type silicon. This differential etch rate results in a detectable difference in elevation between the P-type and N-type regions. Other methods are suitable to align the masks. For example, double-sided alignment is achieved by transferring a master pattern, which is originally formed on backside surface 238, to substrate surface 244 after bonding.

In a further alternative embodiment, a silicon-on-insulator (SOI) structure is used as a starting wafer in which a silicon dioxide layer is incorporated between the element layer and a thick silicon mechanical support layer. The silicon dioxide layer is formed at the surface of the support wafer. This silicon dioxide layer is etched with an alignment pattern prior to the formation of an element layer that buries the etched silicon dioxide layer. Frontside masks are aligned to the buried alignment pattern using infrared or double-sided alignment techniques. During backside surface processing, the silicon dioxide layer is used as a silicon etch stop to precisely define the backside of the element layer. The alignment pattern is used to align backside masks to frontside masks.

Figure 2E:
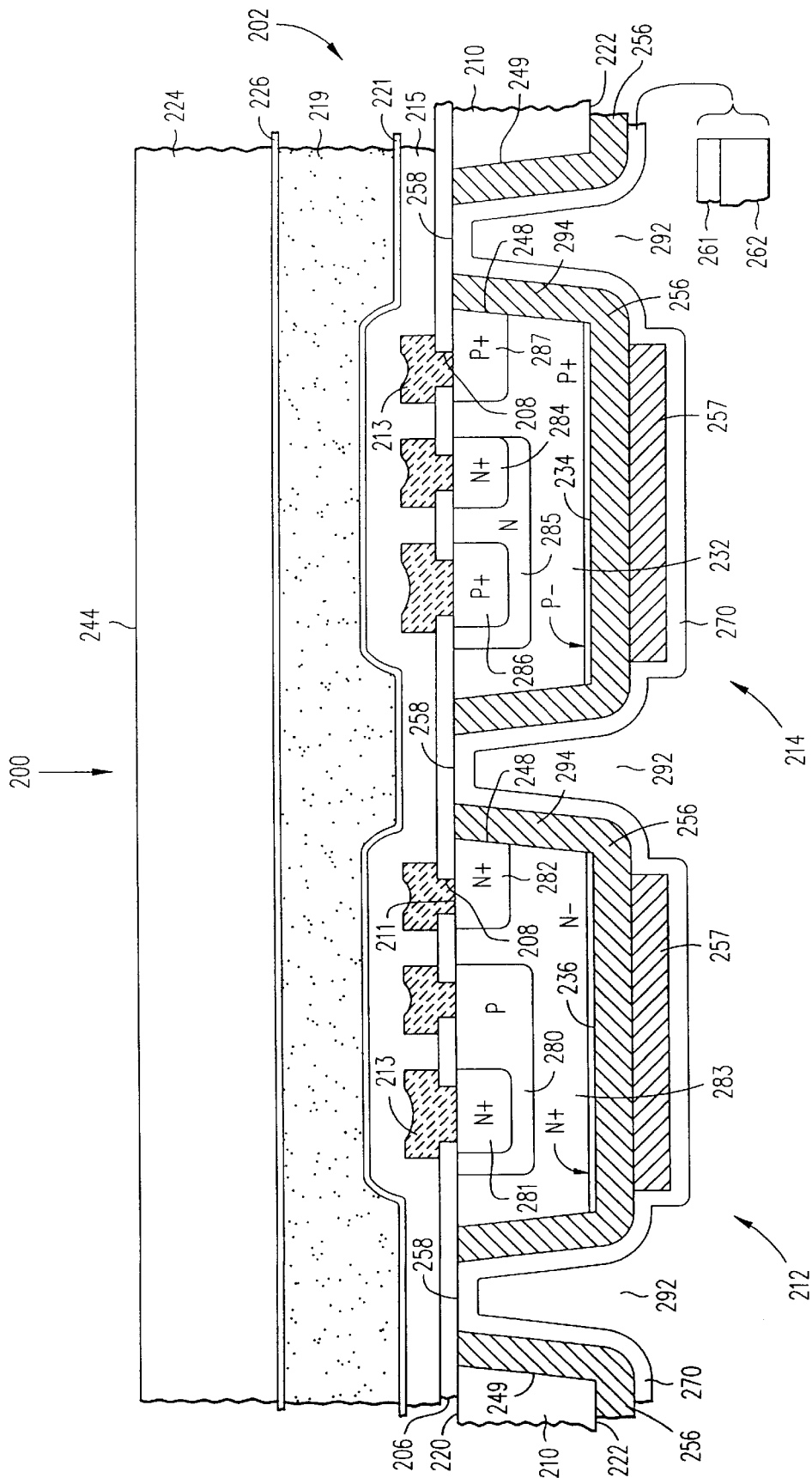
Figure 2F:
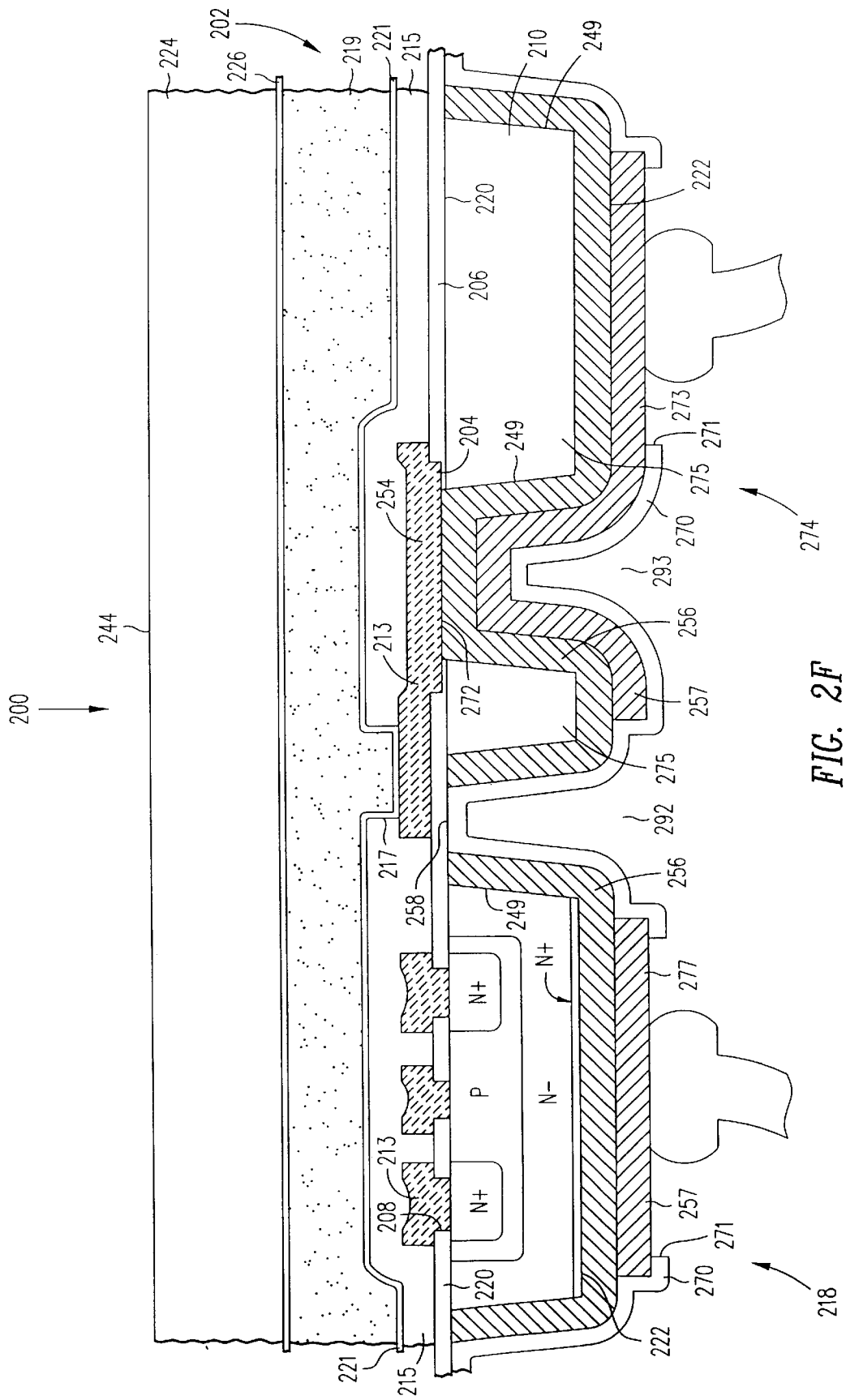

FIG. 2(e) illustrates a processing step for fabricating the portion of enclosed bipolar device circuit 200 shown in FIGS. 2(a) through 2(d). This portion includes NPN transistor 212 and PNP transistor 214. FIG. 2(f) illustrates a processing step of a different portion of bipolar device circuit 200. The circuit 200 portion shown in FIG. 2(f) includes a bonding pad structure 274 and a power transistor 218.

Referring to FIGS. 2(e) and 2(f), isolation trenches 292 and a bonding pad via 293 are etched into element layer 210 by depositing a layer of silicon nitride (not shown) on opposing surfaces 222 and 244 on each side of composite semiconductor wafer 202. The silicon nitride layer is patterned on backside surface 222 (not shown) to open trenches 292 and via 293 exposing silicon surface 222. The composite semiconductor wafer 202 is immersed in an anisotropic silicon etchant, for example KOH-alcohol-water, which etches silicon nitride very slowly. Other suitable anisotropic silicon etchants include solutions of hydrazine, ethylenediamine-pyrocatechol-water solution (EPW) and tetramethyl ammonium hydroxide. Anisotropic silicon etching creates isolation trenches 292 and bonding pad via 293 having sidewalls 249 with a slope of approximately between 50° and 55° relative to the extension of backside surface 222 over the trench. Other suitable anisotropic etch processes include "dry" processes such as reactive ion etching (RIE) which is effective on all crystal orientations and where the slope trench can be controlled up to an angle approaching 90°. In some applications, for example high density applications, RIE is preferred. Silicon etching processes are chosen to control a trench sidewall profile so that adequate step coverage is provided for subsequent metal and dielectric depositions. For this purpose wet and dry anisotropic etching is preferred but wet or dry isotropic etching is also useful. The silicon nitride layer is removed from backside surface 222 and substrate surface 244 and semiconductor wafer 202 is patterned to open via region 293. Etching of the irregular backside surface 222 created by isolation trenches 292 and via 293 utilizes a photoresist having a high viscosity which is applied in thicknesses typically greater than the trench depth. Thus, for example, a thick photoresist mask having an opening greater than the width of via 293 at the level of the backside surface 222 is applied to surface 222. Optionally, the thick resist process may also be employed to define and open, for example, selected oxide regions at the foot 258 of trenches 292 where frontside interconnect layer is connected.

Semiconductor wafer 202 is etched by immersion into a bath containing dilute aqueous hydrofluoric acid to clear thin oxide region 204 at the foot 272 of bonding pad via 293, thus exposing the underside of a metal pad 254 formed in interconnect metallization layer 213.

A conductive layer 256, which in some embodiments is constructed from tungsten, is deposited by selective chemical vapor deposition (CVD) that results in a self-aligned deposition on exposed silicon regions of backside surface 222 and sidewalls 249 and on metal via foot 272, but not on the silicon oxide layer 204 (see FIG. 2(b)) which is exposed at the foot 258 of isolation trenches 292.

Conductive layer 256, when heated during subsequent processing, forms ohmic contacts with element layer 210 regions 234 and 236, which have a high concentration of dopant ions. Conductive layer 256 in this manner forms low resistance lateral collector lead outs for PNP collector region 234 and NPN collector region 236. In this manner, the illustrative process furnishes fabrication of an integrated circuit or discrete device in which ohmic contact is made in close proximity to an active collector or drain or to exposed backsides of device elements through creation of heavily doped or selectively doped regions in the element backside while maintaining the element front surface at a low temperature. In a similar manner applicable to other embodiments which are not illustrated, a device element having an active junction in the exposed device backside is constructed by selectively doping of the backside surface 222 while the frontside surface 220 of the wafer is maintained at a low temperature.

Conductive layer 256 also forms ohmic contacts with high concentration frontside collector ohmic diffusions 282 and 287, which are uncovered in regions 248 of the sidewall 249 of the adjacent isolation trench 292 thus forming low resistance vertical collector leadouts 294. To improve sidewall ohmic contacts, collector plugs (not shown) are added, extending below frontside diffusions 282 and 287.

Anisotropic etchants such as KOH and EPW do not etch P-type silicon which has a dopant concentration greater than approximately $7 \times 10^{19}$ cm$^3$. For this reason, an extension of P$^+$ diffusion 287, which is more heavily doped, remains (not shown) at the foot 258 of isolation trench 292. Conductive layer 256 is therefore deposited on this P$^+$ extension of P$^+$ diffusion region 287, and the increased contact area reduces contact resistance.

Note that conductive layer 256 short-circuits any junction that is positioned between NPN collector region 283 and the collector ohmic contact region 282 so that opposite-type P$^+$ collector ohmic contact regions is optionally utilized advantageously with N-type collector regions.

Tungsten is not a suitable metal for conventional wire bonding however. Therefore backside metal layer 257, which is composed principally of aluminum, is deposited and patterned on bonding pad structure 274 and power transistor 218, and also optionally on transistors 212 and 214 to further reduce lateral leadout resistance. Bonding pad via connection 272 is formed at the foot of via 293, which is enclosed within bonding pad structure 274 and surrounded by continuous silicon element 275. Bonding pad device 274 thus provides a low resistance connection between bonding pad 273 and frontside interconnect metal layer 213.

In applications in which low resistance is not important, a bonding pad device is optionally employed which does not include a via connection. Instead ohmic contacts are formed on surfaces 220 and 222 so that the silicon region under the bond pad 273 interfaces between the bond pad 273 and the frontside interconnect layer 213. In other embodiments (not shown), multiple bonding pads are opened directly on layer 213 by lithography and etching of oxide layer 204.

Backside metal layer 257 of power transistor 218 supplies a connection for wire bonding. Backside metal layer 257 is also useful for reducing collector resistance. Power transistor 218 is much smaller and has higher performance than conventional integrated power devices which must employ diffused buried layers, vertical collector leadouts, and frontside collector interconnects and bonding areas.

For circuit embodiments in which performance of power devices, for example device 218, is more important than other considerations such as reduction of vertical leadout resistance of control circuits for example, conductive layer 256 is not included so that backside metal layer 257 makes direct ohmic contact with collector regions. However, backside metal layer 257 may also be patterned to extend onto the trench sidewalls 249 and onto the foot 258 of trenches 292 (not shown) for various purposes. For example, backside metal layer 257 may form sidewall ohmic contacts 248 with frontside collector ohmic regions or form direct contacts with frontside metal interconnect layer 213.

Dielectric layer 270, which includes a silicon oxide layer 261 containing a small amount of phosphorous oxide to attract mobile ions in a gettering process and a silicon nitride layer 262, is deposited. Dielectric layer 270 serves as a junction seal at the frontside surface 220 of element layer 210 where surface 220 is exposed at the foot 258 of isolation trenches 292. Nitride layer 262 is a barrier against ionic contaminants. Dielectric layer 270 also forms an electrical insulator between device elements and backside interconnect metallization (not shown) which may be routed into and across trenches 292. Dieelectric layer 270 seals and electrically isolates individual devices, mutually and against the extrinsic environment. Dielectric layer 270 is patterned to open aperture 271 exposing interconnect layer bonding pad 273 and collector bonding pad 277. Semiconductor wafer 202 is heated to a temperature of approximately 450° C. to sinter the ohmic contact regions of circuit 200.

Although FIGS. 2(a) through 2(f) depict a silicon bipolar circuit fabrication process embodiment, other embodiments are included within the spirit and scope of the invention which apply to other technologies, such as technologies that employ element layers and wafers of semiconductor materials such as SiC, diamond or GaAs, to MOS and junction FETs, to lateral as well as vertical devices, and to discrete devices and integrated circuits of all kinds. Furthermore, other materials and processes are optionally employed to extend the usefulness and capabilities of the circuit. For example, silicon wafer 201 is not limited to <100> orientation or heavy N-type doping. With sufficiently accurate wafer thinning processes, built-in element thickness control is not necessary so that silicon wafer 201 serves as a temporary element layer thus avoiding the cost of a deposited or bonded element layer 210. Furthermore, the electrochemical method described also applies for <111> orientation as well, and concentration-dependent chemical etchants such as HF-acetic acid-$HNO_3$ mixtures may also be used to selectively etch heavily doped N-type or P-type silicon having <100> or <111> orientation.

A P-N junction electrochemical etch stop is optionally used with <100> material and anisotropic etchants. In this approach (not shown) silicon wafer 201 is lightly doped with P-type ions and element layer 210 is deposited to a greater thickness to prevent P-type collector region 232 from penetrating element layer 210. In further additional embodiments, conventional buried layers are employed to form backside ohmic contacts or active junctions which are optionally enhanced by backside doping. High temperature wafer bonding is employed to form an element layer 210 which optionally incorporates buried layers. Furthermore, wafer bonding and other silicon-on-insulator (SOI) techniques are optionally employed to form an element layer on an oxide etch stop layer to enable precise control of element layer thickness. Such an SOI element layer employs buried layers to allow the fabrication of transistors and other devices on the element backside which are passivated with thermal oxide.

In an application in which chemical or electrochemical etching is employed to control element thickness, when buried layers (not shown) are employed, an additional lightly doped buffer epitaxial layer is used to isolate from silicon wafer 201 buried layers of the same conductivity type.

Alternative materials may be employed to form bond layer 219. These alternative materials include materials commonly used for die-attachment, such as soft and hard solders, and adhesives with thermally or electrically conductive powder fillings. Of particular interest is a recently reported bonding process employing layered depositions of pure metals that melt and bond initially at a low temperature but form upon cooling a eutectic alloy with a high melting temperature. Such a process is described in "Au-In Bonding Below the Eutectic Temperature," C. C. Lee, C. Y. Wang and G. Matijasevic, IEEE Transactions on Hybrids, and Manufacturing Technology, May, 1993 pp. 311–316. Furthermore, bond layer 219 may be formed wholly or partially on support substrate 224.

Alternative backside doping processes include conventional collimated beam ion implantation into the silicon or silicide surface 222, selective growth of doped silicon, or plasma immersion ion implantation (PIII). PIII is also used to implant ions in sidewalls of isolation trenches.

Alternative "dry" anisotropic trench etching methods include reactive ion etching (RIE) etching which is employed with a material having either a <100> or <111> orientation. Wet and dry etching including wet and dry isotropic etching is used in combination to tailor the shape of trenches or the surface finish of trench sidewalls.

Materials which are employed as passivation or interconnect dielectric layers have improved thermal conductivity compared to convention materials consisting principally of silicon oxide. These dielectric materials are selected to form insulating dielectric layers of support substrates. These dielectric materials are selected from a group including for example diamond, diamond-like carbon, aluminum nitride, silicon carbide, boron nitride, aluminum oxide and silicon nitride.

In some processes, a permanent conductive or bonding metal layer in contact with the backside surface is advantageously employed as a protective mask for trench etching, thus forming self-aligned trench structures. A self-aligned trench is also formed using a permanent metal layer in contact with the backside surface and overlaid by a temporary protective layer. Using a protective layer which is resistant to the etchant utilized for etching the metal, the permanent metal layer is undercut-etched to adjust the spacing between the metal edge and the edge of the trench.

In some embodiments, the permanent metal layer is deposited and patterned before the trench etch protective layer is deposited and patterned.

Support substrates are optionally be constructed from materials other than silicon. Support substrates are machined by various means to provide through-holes and channels for gas or liquid cooling. Furthermore, support substrates optionally incorporate semiconductor devices including integrated circuits, passive devices such as capacitors and resistors, or metal interconnect layers. In this manner stacked electronic structures are fabricated that incorporate many interconnect layers of devices and circuits.

Frontside and backside interconnect metallization systems employ conventional structures incorporating for example silicides, diffusion barriers, contact plugs, adhesion layers, and conductor layers. In these applications, silicides are formed for example principally from metals such as Pd, Pt, Ti, W, Ni, Cr, or Co. Diffusion barrier and adhesion layers are formed principally from materials such as Ti, TiN, Pt, W, Ni or Cr. Conductor layers are formed principally from metals such as Al, Mo, W, Cu, Au, or Ag. These materials are also used to construct bond interface layers which are compatible with the various combinations of bonding materials, metal interconnect layers, support substrates and dielectric layers.

Multilayer metallization systems employing barrier metal layers are optionally configured to furnish contacts which tolerate high temperatures, thus permitting a greater range of processing choices for backside thermal processing. A single barrier layer composed of TiN withstands temperatures up to 550° C. while avoiding contact failures.

The backside surface 222 is also optionally configured to include passive devices such as capacitors and laser-trimmed thin film resistors. Conventional solder bumps and gold bumps, for example, may be applied to backside metallization to accommodate flip chip assembly techniques.

The illustrative circuit 200 shown in FIG. 2(f) forms an intrinsically hermetic device with its circuit frontside buried within the composite semiconductor wafer 202. An illustrative circuit 200, which is optionally equipped with a gold backside metal, is highly resistant to failures due to interconnect corrosion or mobile ion contamination, which would degrade the performance of a conventional device.

Furthermore, a device backside is optionally exposed to the package environment to facilitate improved cooling of the circuit, and large metallized areas such as collectors or drains of power devices present an opportunity for the direct attachment of fixtures to conduct heat from the device.

The semiconductor fabrication method that is illustrated in FIGS. 2(a) through 2(f) is exploited to construct various novel semiconductor devices. Some of these devices are illustrated in FIGS. 3 through 10.

Figure 3:
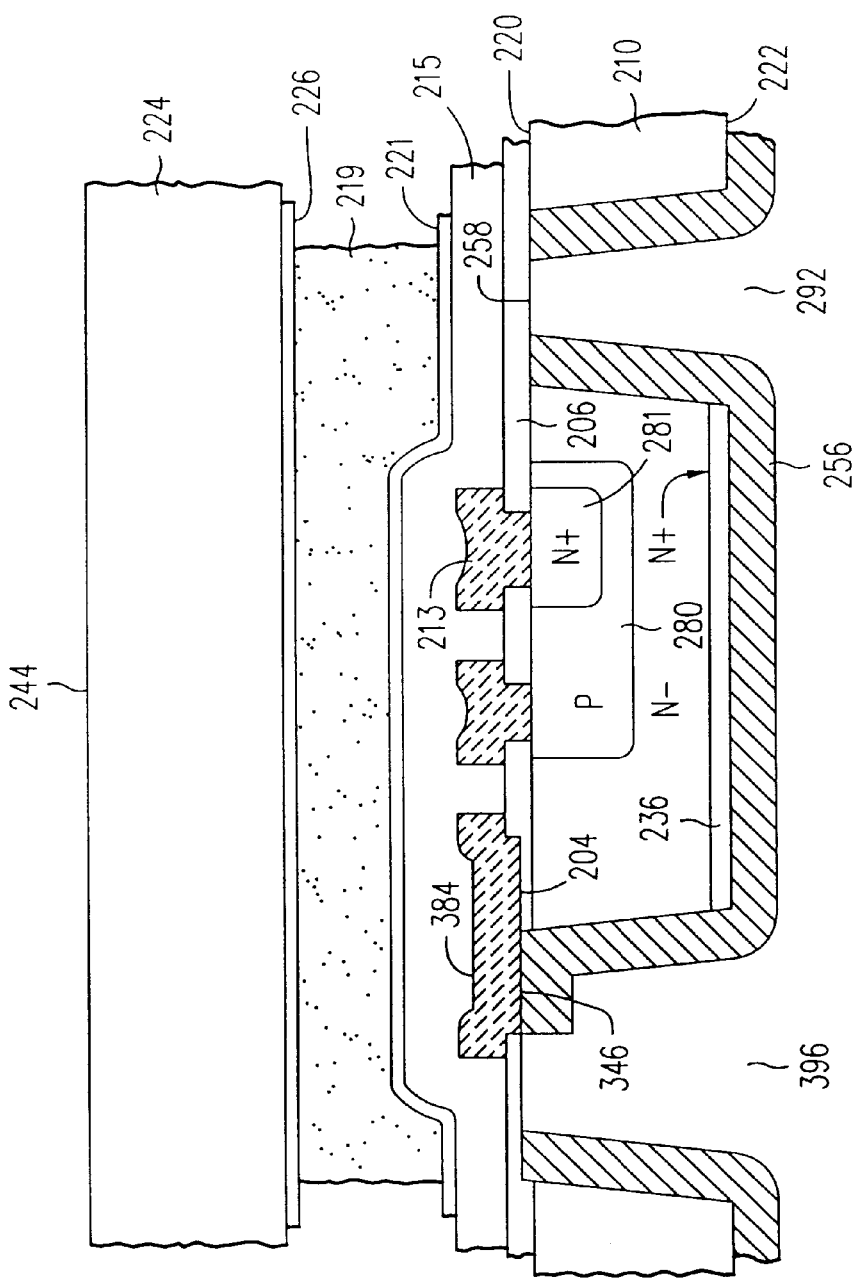
FIG. 3 is a schematic cross-sectional view of an embodiment of a semiconductor circuit which has a reduced vertical leadout resistance and is fabricated using the method illustrated in FIGS. 2(a) through 2(f)

FIG. 3 illustrates a circuit enhancement which further reduces vertical leadout resistance. Subsequent to formation of isolation trenches 292 and 396, via contact region 346 is formed by patterning trench 396 and etching oxide layer 204 exposed at the base 258 of trenches 292 and 396. Conductive layer 256 is then selectively deposited on exposed bottom interconnect metallization layer 213 in the via opening and on the exposed NPN collector region 236 to form frontside collector terminal 384.

The illustrative circuit 300 furnishes an integrated circuit in which the lateral and vertical leadout resistance of semiconductor devices is reduced by a metal layer (e.g. conductive layer 256) connected in close proximity to the active collector or drain, to the isolation sidewalls, and to frontside interconnect metal layers.

Figure 4:
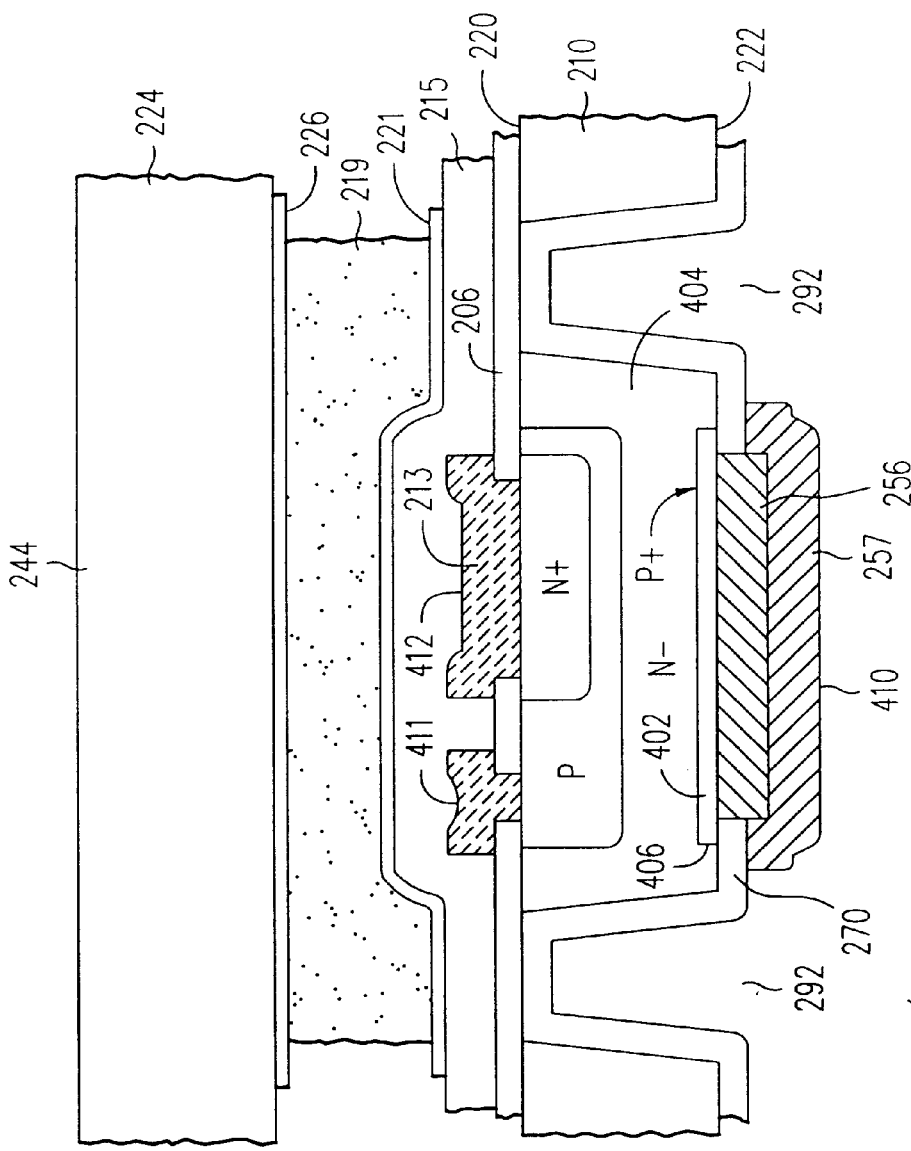
FIG. 4 is a schematic cross-sectional view of an embodiment of an integrated four layer PNPN device, such as a silicon controlled rectifier (SCR), which is fabricated using the method illustrated in FIGS. 2(a) through 2(f)
Figure 5:
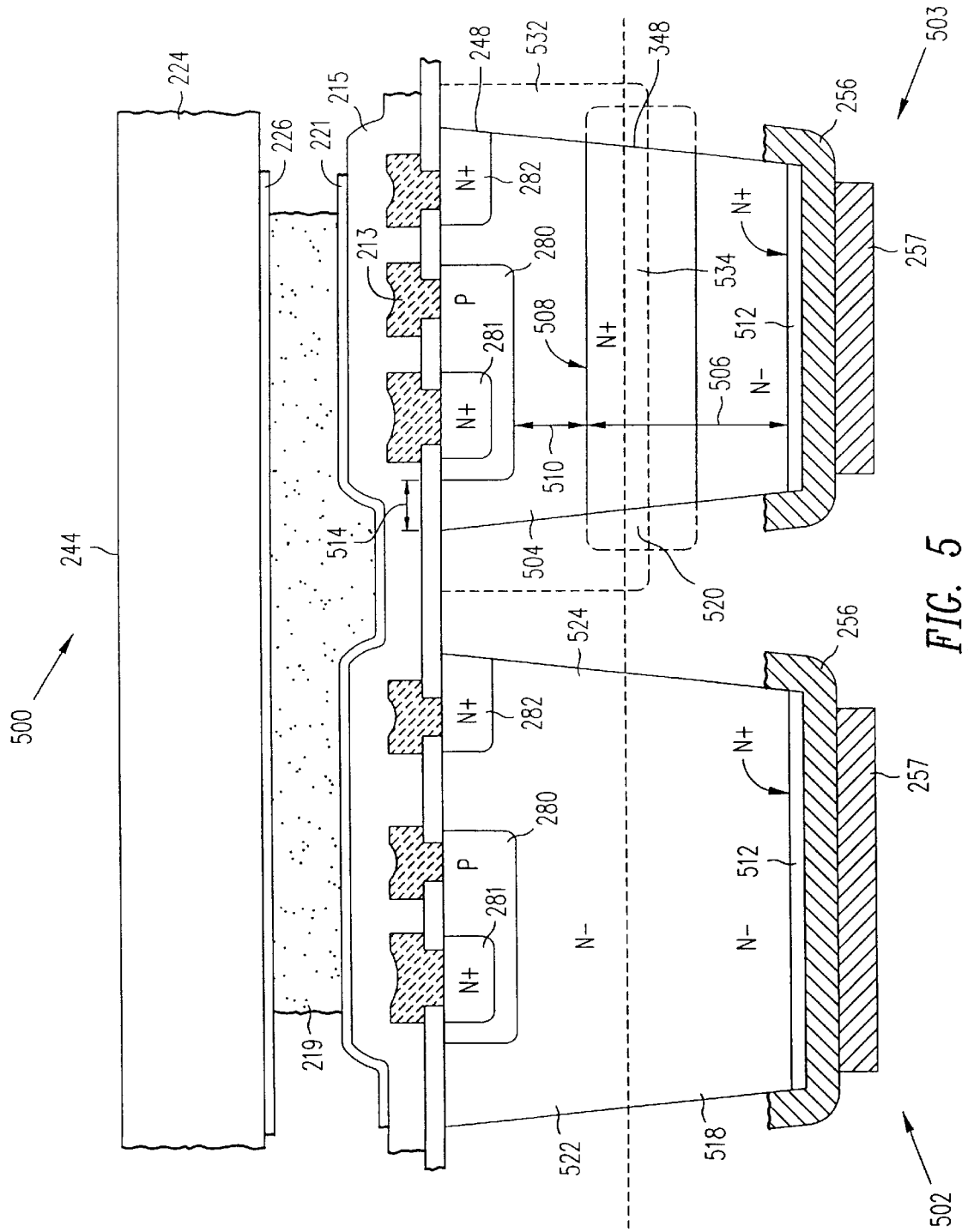
FIG. 5 is a schematic cross-sectional view of an embodiment of a circuit which furnishes low and high voltage devices on the same chip and is fabricated using the method illustrated in FIGS. 2(a) through 2(f)

Referring to FIG. 4, an integrated four layer PNPN device 400 such as a silicon controlled rectifier (SCR) is fabricated using the method illustrated in FIGS. 2(a) through 2(e). After a portion of silicon wafer 201 and element layer 210 are removed, as is shown in FIG. 2(d), and the backside surface 222 of element layer 210 is exposed, a heavily doped P-type region 402 is formed in a lightly doped N-type collector region 404 and a surface junction 406 which is thereby formed is protected by backside dielectric layer 270 which forms a junction seal. Backside metal layer 257 allows wire bonding directly to the anode 410 where frontside metal terminals 411 and 412 are respectively the gate and cathode of device 400;

Referring to FIG. 5, an embodiment of a circuit 500 is shown which furnishes both an optimized high voltage vertical NPN device 502 and a low voltage device 503 with an improved performance and density. A vertical device has a maximum voltage rating which is determined by the resistivity and thickness of an active collector layer 504. A higher resistivity and thicker layer are characteristic of a device optimized for high voltage performance such as device 502. The performance and density of a device operating at a low voltage is reduced if the device includes high voltage collector regions, since an additional vertical-collector resistance is created by a high resistance region 506 between the base 508 of a low voltage active region 510 and a lateral collector leadout region 512. Furthermore, lateral base-to-sidewall spacing 514 of a low voltage device is increased by the additional width that a base depletion layer spreads in a high resistivity collector.

In an illustrative embodiment of the circuit 500, a first lightly doped N-type epitaxial layer 518 is deposited and a heavily doped N-type buried layer 520 is created by diffusion. A second lightly doped N-type epitaxial layer 522 is deposited, which combines with N-type epitaxial layer 518 to form a collector region 524 of high voltage NPN transistor 502. A collector region 528 of a low voltage NPN transistor 503 is formed by implantation and diffusion of an enhanced N-type region 532 which extends to overlap the outdiffusion of N-type buried layer 520 into N-type epitaxial layer 518. Doping of low voltage active collector region 510 is thereby improved by enhancement diffusion of N-type region 532 while the thickness of low voltage active region 510 is controlled by the thickness of N-type epitaxial layer 522 and the doping of N-type buried layer 520. N-type buried layer 520 forms a lateral collector leadout 534 which makes an ohmic contact with the metal conductive layer 256 at the trench sidewall 348 where the high concentration region of buried layer 520 is intersected by the trench. Lateral leadout buried layer 520 is employed when its resistance is less than that the vertical resistance contributed by high resistivity region 506.

The illustrative circuit 500 is constructed so that the lateral and vertical leadout resistance of circuit semiconductor devices is reduced by the N-type ion-diffused buried conductive layer 520 which is connected in close proximity to the active collector or drain and to the isolation trench sidewall 248. This embodiment is advantageously used in circuits which combine PNP and NPN devices on the same chip. Various additional epitaxial layers and diffusions are selected to achieve selected device specifications.

Circuit 500 thus incorporates dielectrically-isolated high-density vertical transistors 502 and 503 with low collector resistance, and respectively high and low voltage operating capabilities. In this manner, power integrated circuits and, for example, standard CMOS circuits are combined on the same chip with the power devices being dielectrically isolated from the low-power circuits. Similarly, bipolar circuits and CMOS circuits are combined on a single chip but dielectrically isolated. Individual transistors may even be junction isolated. Circuits of different types and technologies may be isolated individually or in groups.

The illustrative method allows combination of standard bipolar and CMOS technologies with high performance power devices. The advantages of process control and reliable circuit functionality of the conventional bipolar and CMOS processes are retained while circuit functionality is flexibly extended. The illustrative method makes possible these improvements by allowing the element thickness of the high voltage device to be separated into a series of epitaxial depositions and buried layer diffusions, each having a selected doping level. Other embodiments are optionally created which combine high voltage and high current capabilities with the density and speed of existing conventional process. One exemplary circuit combines high voltage devices on the same chip as control circuitry.

Figure 6:
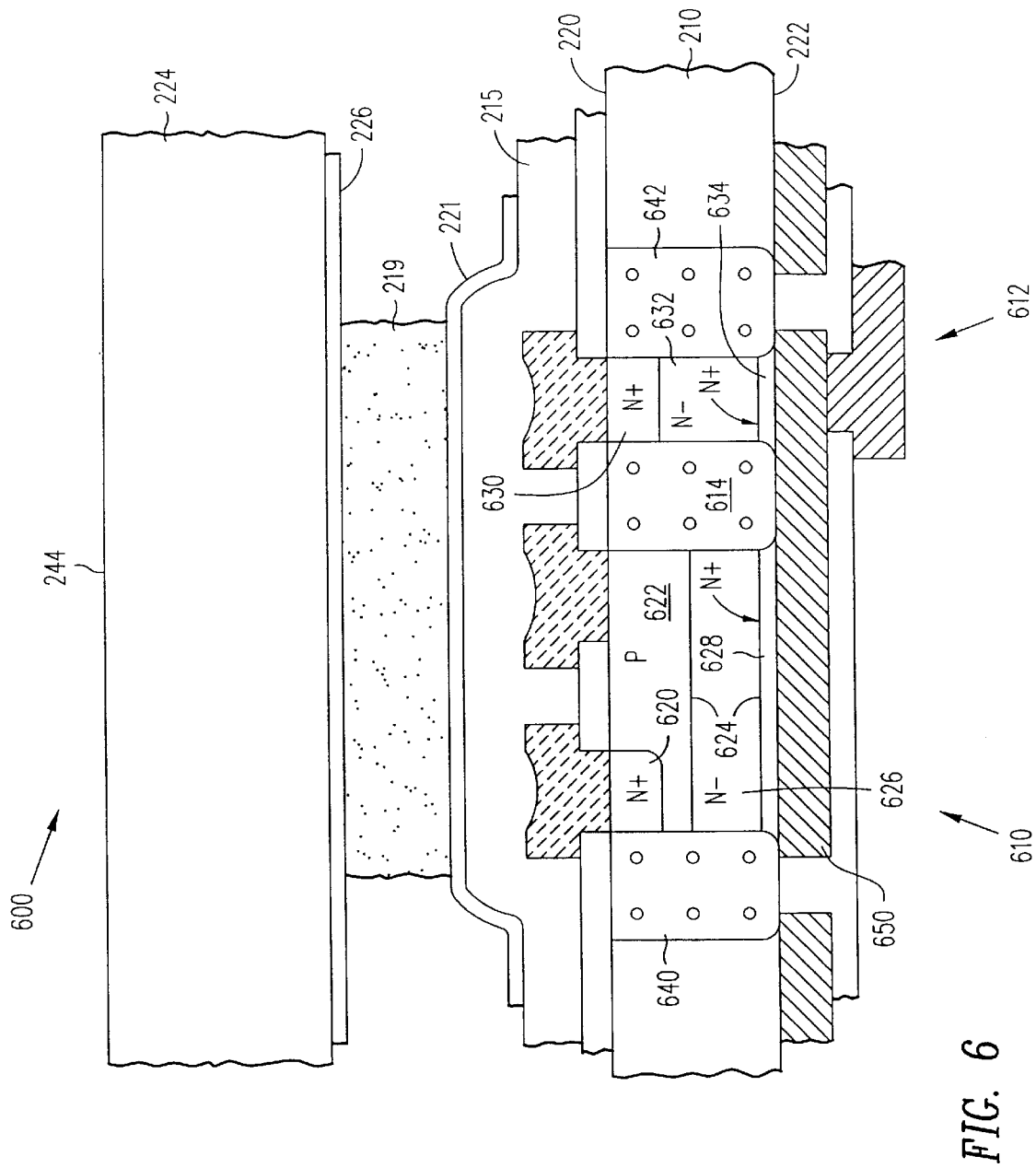
FIGS. 6 and 7 are schematic cross-sectional views of two embodiments of an NPN transistor circuit in which LOCOS (local oxidation of silicon) regions furnish full or partial lateral isolation of device elements.

Referring to FIG. 6, there is depicted an embodiment of an NPN transistor circuit 600 in which device elements in element layer 210 have full lateral isolation by virtue of LOCOS regions (local oxidation of silicon) incorporated from the element frontside as part of a conventional frontside processing. LOCOS regions are typically employed to laterally isolate high-speed and high-density MOS and bipolar circuits. LOCOS isolation regions such as region 640 are constructed principally of silicon oxide and are formed from the element frontside by, for example, etching silicon from an isolating region to a depth of approximately half of the desired depth of the LOCOS and then oxidizing the etched region while protecting surface 220 with an oxidation barrier such as a silicon nitride layer. The silicon oxide formed in the etched region expands to fill the region with a surface substantially level with surface 220.

NPN transistor circuit 600 includes a vertical transistor structure 610 and a vertical collector leadout structure 612, which are mutually isolated by an interior LOCOS region 614. Interior LOCOS region 614 extends fully across element layer 210 from frontside surface 220 to backside surface 222. Vertical transistor structure 610 includes an $n^+$-ion emitter region 620, a p-ion base region 622 and an n-ion collector region 624. The n-ion collector region 624 includes an n region 626 and a heavily doped $n^+$ region 628. The vertical collector leadout structure 612 includes an $n^+$-ion region 630, an $n^-$-ion region 632 and a heavily doped $n^+$ region 634. The heavily doped $n^+$ regions 628 and 634 are created by the process of removing backside portions of silicon wafer 201 and element layer 210, as is shown in FIG. 2(d), and doping the exposed element layer 210 surface. Heavily doped n+ regions 628 and 634 furnish ohmic contact to the active collector 624 of NPN transistor circuit 600 and to the backside surface 222 of the vertical collector leadout region 612. A patterned metal layer 650 supplies an electrical connection between vertical transistor structure 610 and vertical collector leadout structure 612.

Vertical transistor structure 610 and vertical collector leadout structure 612 are isolated from other devices of element layer 210 by LOCOS regions 640 and 642, respectively. LOCOS regions 640 and 642 extend fully across element layer 210 from frontside surface 220 to backside surface 222. LOCOS regions 614, 640 and 642 form sidewalls for emitter 620, base 622, collector 624 regions and vertical collector leadout structure 612 and are formed as a silicon oxide wall which furnishes full lateral isolation of element layer 210, thus furnishing a structure with high packing density and low sidewall capacitance. For high-voltage applications, deep lateral isolation regions are suitably formed using a trench which is lined with silicon oxide and filled with polysilicon, for example.

In this embodiment of NPN transistor circuit 600, the final thickness of element layer 210 is determined by the depth of the LOCOS regions 614, 640 and 642 since the silicon oxide that constitutes these regions is, in comparison with the silicon of element layer 210, hard and resists the polishing process used to precisely thin element layer 210.

Figure 7:
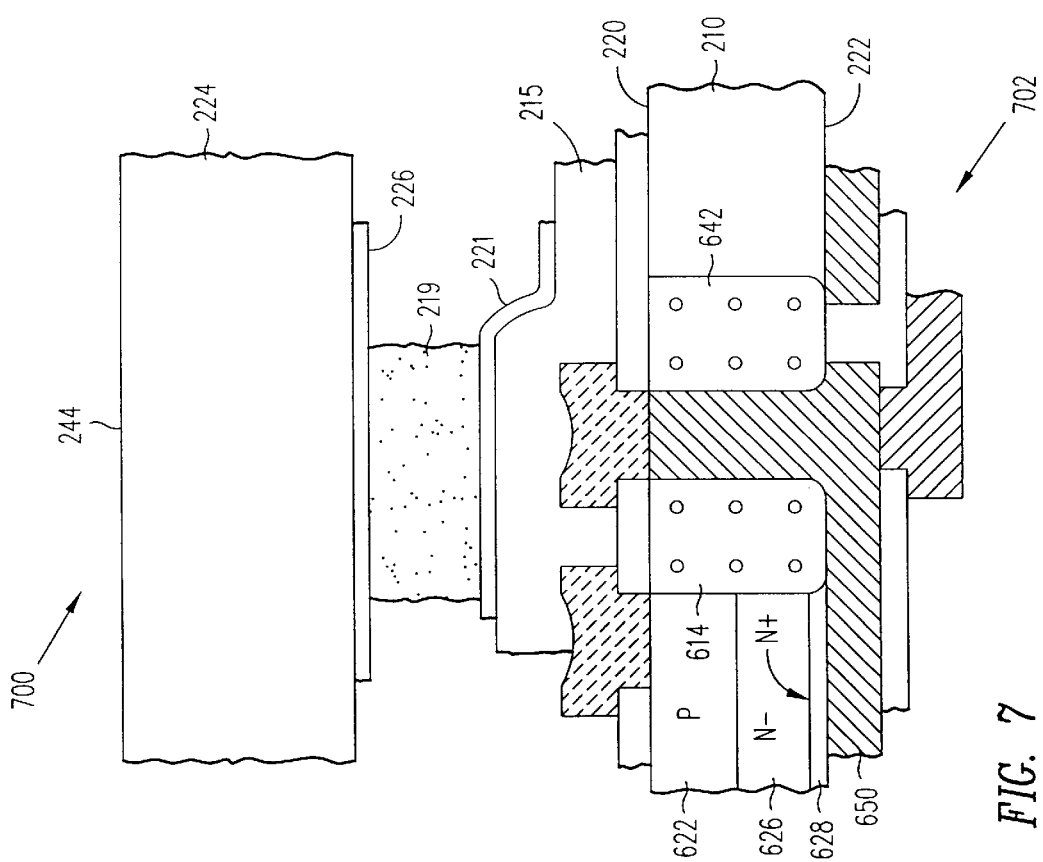

Referring to FIG. 7, there is shown an embodiment of an NPN transistor circuit 700 which is similar to the NPN transistor circuit 600 illustrated in FIG. 6 except that the vertical collector leadout structure 612 is replaced by a metal via 702. During fabrication of NPN transistor circuit 700, when backside portions of silicon wafer 201 and element layer 210 are removed, as is shown in FIG. 2(d), the portion of element layer 210 that is located in the region of the vertical collector leadout 612 is etched out to form a trench (not shown). This trench is filled with metal layer 650 by a process such as tungsten chemical vapor deposition (CVD) which forms a substantially-level metal layer surface. Metal layer 650 is patterned to furnish an electrical connection between vertical transistor structure 610 and metal and metal via 702.

In an additional enhancement of the embodiment shown in FIG. 6, silicon leadout region 612 is optionally etched out to form the metal via 702 which reduces vertical leadout resistance and furnishes a direct connection between frontside surface 220 and backside surface 222 interconnect layers.

In other embodiments, frontside LOCOS or filled-trench lateral isolation regions and backside isolation trenches (e.g. isolation trenches 292 shown in FIGS. 2(e) and 2(f)) are variously combined, as desired. For circuits combining these isolation techniques, a backside trench mask is aligned to the frontside isolation regions and the oxide at the foot of the frontside trenches becomes the foot of the backside trenches.

Using the illustrative method shown in FIGS. 6 and 7, conventional LOCOS or filled-trench isolation is used to precisely control element layer thickness, providing not only the previously established advantages of a reduced collector resistance but also permits construction of an advantageous metal via structure of a direct metal connection between frontside and backside interconnect layers. Thus higher performance circuits are fabricated with full utilization of the backside surface for multi-layer metal interconnects.

Figure 8:
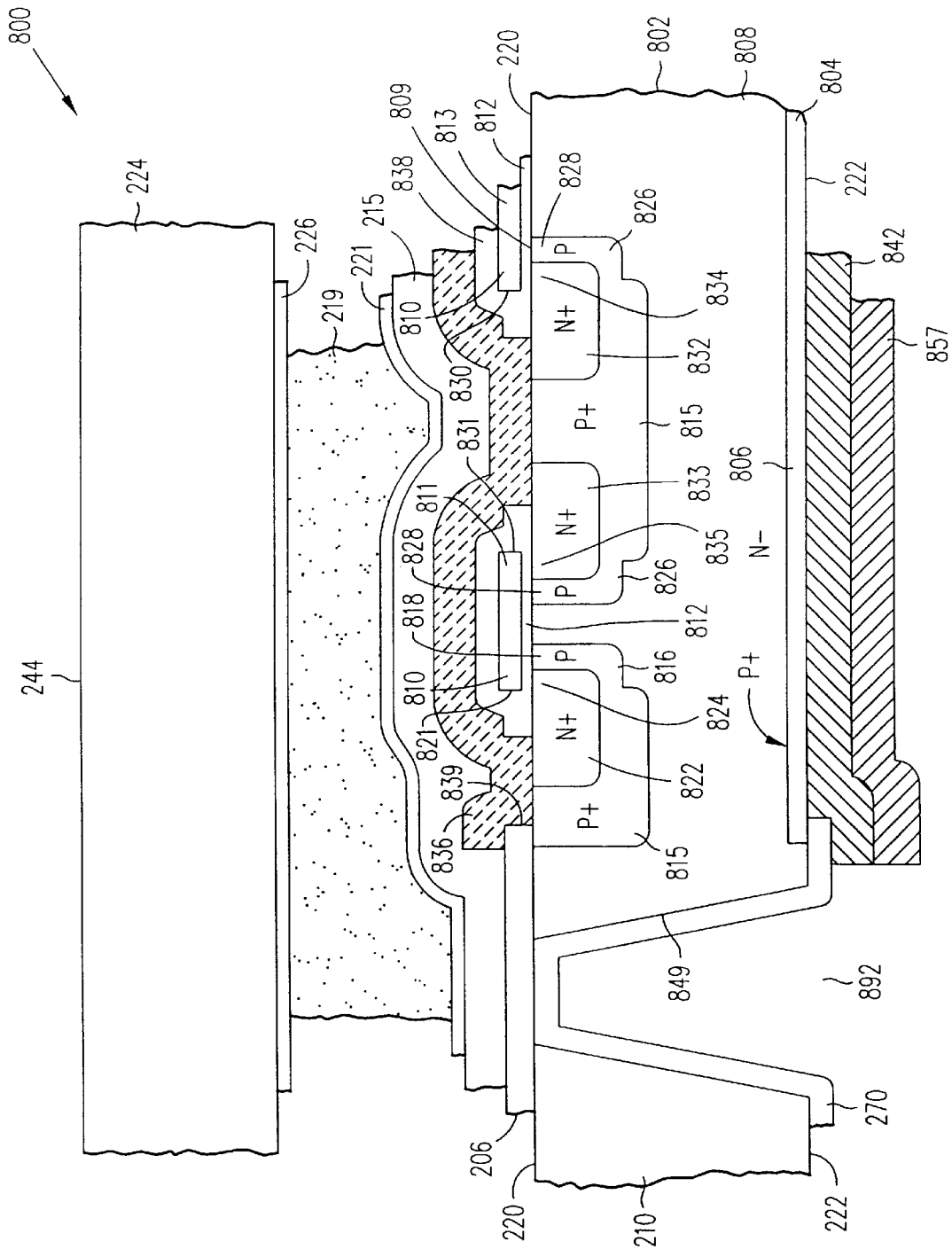
FIG. 8 is a schematic cross-sectional view of an embodiment of a vertical insulated gate bipolar transistor (IGBT) which combines characteristics of bipolar and MOS devices and is fabricated using the method illustrated in FIGS. 2(a) through 2(f)

Referring to FIG. 8, an embodiment of a vertical insulated gate bipolar transistor (IGBT) 800 is illustrated which combines MOS and bipolar technologies to achieve the advantages of a low drive current and high output current density. In accordance with the fabrication method illustrated in FIGS. 2(a) through 2(f), the IGBT embodied in the structure shown in FIG. 8 is incorporated in a power IC in combination with adjacent power devices of the same or different constructions and in combination with control and monitoring circuit devices.

IGBT 800 combines an N-channel double-diffused MOS structure (DMOS) 802 with a bipolar emitter 804. Bipolar emitter 804 is formed by heavily doping the $P^+$ emitter region 806 on the exposed backside surface 222 of the N-doped element layer 210 following removal of backside portions of silicon wafer 201 and element layer 210, as is shown in FIG. 2(d). Doping of the $P^+$ emitter region 806 in this manner supplies a heavy doping for high injection efficiency and evenly distributes dopants across the P+ emitter region 806 so that a uniform potential is generated for uniform injection of minority carriers into a DMOS drain region 808. These characteristics of the P+ emitter region 806 are not achieved using conventional integrated circuit fabrication processes so that vertical IGBTs are heretofore rarely implemented.

DMOS channel region 809 is formed by oxidizing surface 220 of the element layer 210 to form a thin layer of gate oxide 812. A polysilicon layer 810 is deposited on the thin gate oxide layer 812 and patterned to form a connected mesh of polysilicon gate regions 811 and 813. A diffused heavily-doped P-type body region 815 is formed by diffusion to construct an enlarged base width for the parasitic NPN device which is intrinsic to the DMOS structure. The enlarged base width reduces the gain of the parasitic device to prevent latchup of the four-layer IGBT structure. A first P-type body region 816 is formed by a self-aligned P-ion lateral diffusion into frontside surface 220 of N− doped element layer 210 with a self-aligned lateral diffused region 818 extending under an edge 821 of polysilicon gate region 811. A first heavily doped N-type source region 822 is formed by a smaller-penetrating self-aligned heavy N-ion diffusion into frontside surface 220 inside the P-type body region 816 of element layer 210 with a self-aligned lateral diffused region 824 extending under the edge 821 of polysilicon gate region 811.

During the doping of the first P-type body region 816, a second P-type body region 826 is formed by a self-aligned P-ion diffusion into frontside surface 220 of N− doped element layer 210 with a self-aligned lateral diffused region 828 extending under the edges 830 and 813 of respective polysilicon gate regions 811 and 813. During the doping of the first heavily doped N-type source region 822, a second heavily doped N-type source region 832 is formed by a smaller-penetrating self-aligned heavy N-ion diffusion into frontside surface-220 inside the second P-type body region 826 of element layer 210 with a self-aligned lateral diffused region 834 under the edge 830 of polysilicon gate region 813. At this same time a third heavily doped N-type source region 833 is formed by a smaller-penetrating self-aligned heavy N-ion diffusion into frontside surface 220 inside the second P-type body region 826 of element layer 210 with a self-aligned lateral diffused region 835 under the edge 831 of polysilicon gate region 811. The selection of dopant, concentration, depth of penetration, and spacing of these lateral diffusions sets the channel length and doping profile which determine the threshold voltage, breakdown voltage and other transistor operating characteristics.

An insulating dielectric layer 838 is deposited to insulate the gate regions, the source and body diffusions, and the frontside surface 220 generally. Dielectric layer 838 is optionally composed principally of silicon oxide. For improved thermal performance, dielectric layer 838 incorporates dielectric materials with higher thermal conductivity. Dielectric layer 838 is patterned to open electrical contact regions 839 to source and body regions and also to the polysilicon meshed gate region (contact not shown). A source metal layer 836 is formed overlying the frontside surface 220 of element layer 210, making direct contact with the exposed first and second P-type body regions 816 and 826, deeper diffused P+ body region 815, and first 822, second 832 and third 833 heavily doped N-type source regions. Source metal layer 836 uniformly distributes current through DMOS source regions and effectively dissipates heat generated by IGBT 800. Source metal layer 836 and polysilicon gate mesh layer 810 (the connected mesh of polysilicon gate regions 811 and 813) are connected respectively to source and gate bonding pads (not shown).

Backside portions of silicon wafer 201 and element layer 210 are removed and P+ emitter region 806 is heavily doped. Backside dielectric layer 270 is formed overlying the backside surface 222 and sidewalls 849 of the element layer 210 having an aperture in the backside region. A conductive layer 842 is formed overlying the backside surface 222 of element layer 210, making direct contact with the exposed P+ emitter region 806. The electrical connection of conductive layer 842 to the uniformly high doped P+ emitter region 806 furnishes a uniform potential, low resistance electrical contact. Backside metal layer 857, which forms the drain terminal and bonding pad of IGBT 800, overlies and contacts conductive layer 842 to distribute drain current evenly over the drain contact region. Backside metal may also be utilized to efficiently dissipate heat through the usage of large diameter bonding wire (not shown), clips (not shown) or the like.

In another IGBT embodiment, P+ emitter 806 is replaced with a Schottky junction formed, for example, by an aluminum metal layer alloyed to drain region 808 or by a silicide layer formed on drain region 808. A Schottky junction is primarily a majority carrier device which emits far fewer minority carriers than a P+ layer. Thus a Schottky junction not only advantageously forms an emitter structure but also allows the IGBT to switch at a higher frequency than is possible with a P+ emitter.

The structure of the circuit 800 shown in FIG. 8 is employed to construct an N-channel DMOS power device by replacing P+ emitter 806 region with a heavily-doped N+ region which forms an ohmic contact in drain region 808. Thus an N-channel DMOS-power device is constructed, rather than an IGBT, merely by changing the doping of region 806.

In a further enhancement of IGBT 800, variously shaped N+, P+ and Schottky regions formed in backside surface are variously connected to form an IGBT optimized for current density and switching speed.

Figure 9:
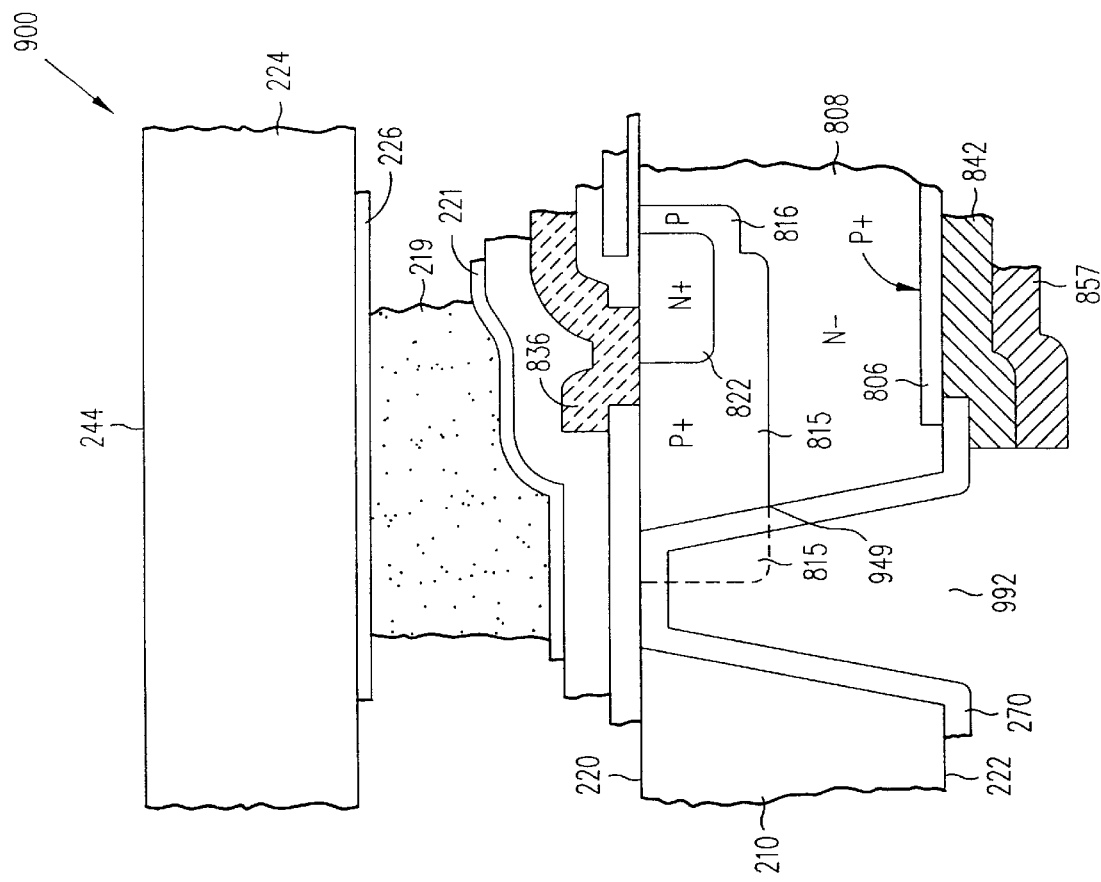
FIG. 9 is a schematic cross-sectional view of an embodiment of the IGBT device shown in FIG. 8 which provides an improved breakdown voltage.

FIG. 9 illustrates a cross-sectional view of an enhanced IGBT device 900 which is an enhanced version of the IGBT device 800 shown in FIG. 8. The enhanced IGBT device 900 includes an improved breakdown voltage behavior. The breakdown voltage of transistors is often limited by strong electric fields which develop at the edge of base or body regions—diffused regions which are more heavily doped than collector or drain regions. In a device such as IGBT device 800, the electric field strength at the edge of the device is often controlled to remain below a critical value by employing, for example, diffused ring regions (not shown) which are doped with an opposite-type doping with respect to the drain.

In IGBT device 800, the minimum spacing between diffused body region 815 and the sidewall 849 of trench 892 is designed to ensure that the body-drain depletion region does not touch the trench sidewall 849 under worst case conditions. The breakdown of devices designed in this manner is thus independent of the structure of the trench. However, the breakdown voltage of discrete devices is improved by a "mesa" process in which individual devices are separated by etching bevelled trenches between the devices, leaving the devices on raised mesa structures. The bevelled trenches are cut at diffused junctions between the devices with a controlled inclination which is combined with optimized doping profiles to improve the breakdown voltage.

IGBT device 900 improves breakdown voltage performance in integrated circuits by employing the mesa technique. The mesa method illustrated in FIG. 9 extends diffused body region 815 into the trench region 992 where trench sidewall 949 bisects region 815. The angle of inclination of sidewall 949 is controlled by, for example, anisotropic and isotropic silicon etching processes, alone or in combination. Doping of the bisected junction is designed in conjunction with the shape of the trench wall to set the breakdown voltage.

Figure 10:
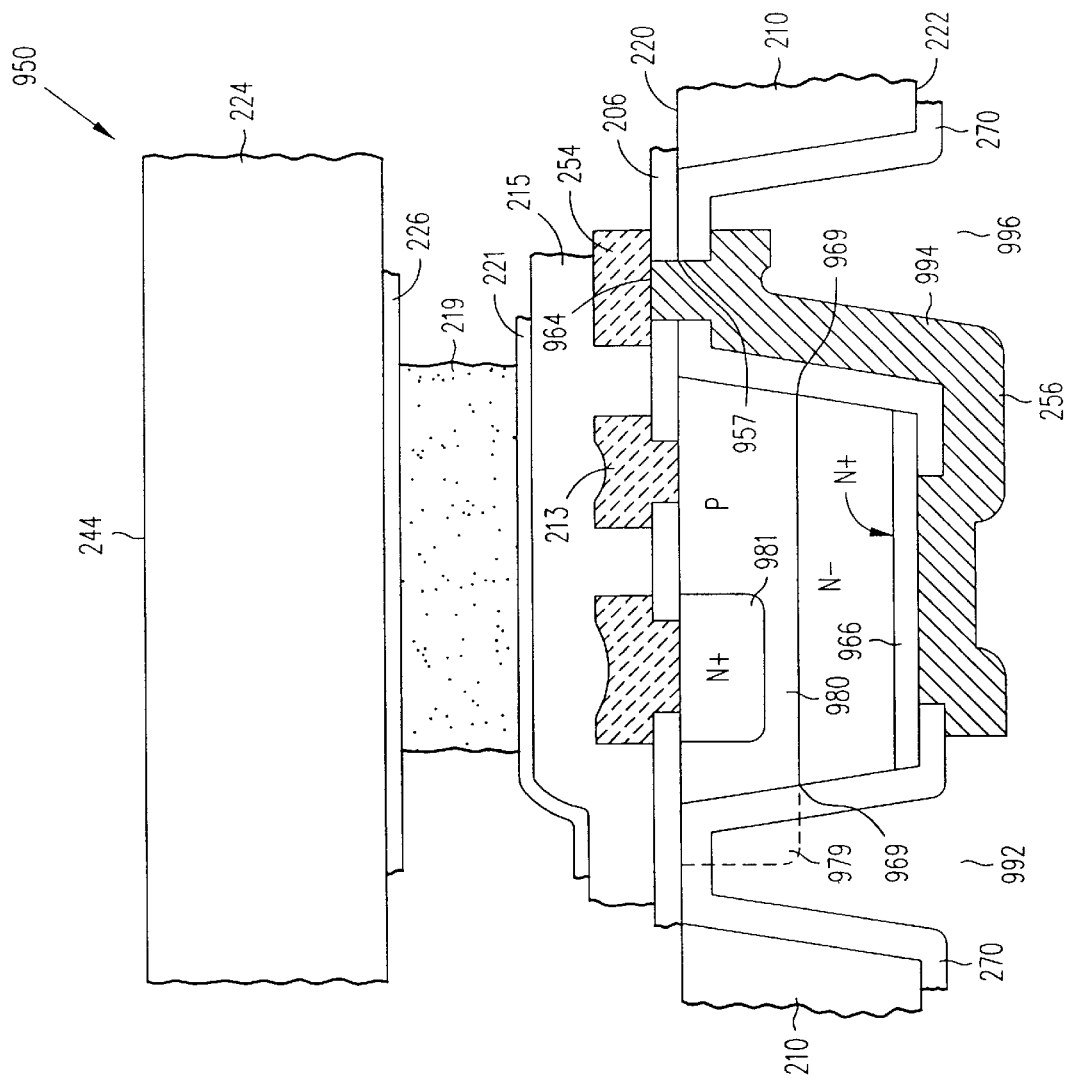
FIG. 10 is a schematic cross-sectional view of an embodiment of an NPN transistor circuit having an improved packing density and an improved high frequency performance, which is fabricated using the method illustrated in FIGS. 2(a) through 2(f).

FIG. 10 shows an embodiment of an NPN transistor circuit 950 having an improved packing density and an improved high frequency performance. NPN transistor 950 employs the mesa method previously disclosed and illustrated by FIG. 9 to construct a device with a reduced base sidewall capacitance and an improved packing density. Transistor 950 also includes a direct connection between frontside metallization layer 213 and collector ohmic region 966. In the construction of transistor 950 P-type base diffusion 979 is extended into or over regions in the substrate where isolation trenches 992 and 996 are subsequently formed. Trench sidewalls 969 bisect P-type base diffusion 979 on all sides to define the base region 980. An emitter region 981 is contained within the base region 980. Metal via contact 964 is formed by patterning junction seal dielectric layer 270 to open via contact 957 through both backside dielectric layer 270 and frontside dielectric layer 206. Deposited conductive layer 256 is patterned to define collector leadout 994 which makes contact to frontside interconnect layer 213 to metal pad 254 at interface contact 964. Transistor 950 has a high density due to the elimination of lateral collector regions between a diffused base region 980 and the isolation trenches 992 and 996. In addition the device has an improved high frequency performance resulting from the reduced base sidewall capacitance and collector leadout resistance.

In other embodiments, device sizes are increased to construct power transistors and the mesa method is employed to improve breakdown voltage characteristics.

While the invention has been described with reference to various embodiments, it will be understood that these embodiments are illustrative and that the scope of the invention is not limited to them. Variations, modifications, additions and improvements of the embodiments described are possible. For example, upon removal of the silicon wafer and a substantial portion of element layer to expose the backside surface of the element layer, additional dielectric layers are optionally incorporated into the semiconductor wafer to serve as chemical etch stops. Furthermore, dielectric or dielectric-lined isolation regions which penetrate into element layer may serve as partial isolation walls or as full isolation and mechanical etch stops.

The embodiments described above are illustrative only and are not limiting. Instead, the scope of the present invention is limited only by the claims which follow.

What is claimed is:

1. An integrated-circuit (IC) chip of the type including a semiconductor section with a plurality of devices contained in corresponding respective device regions laterally disposed throughout the section; a first layer of insulating material underlying the semiconductor section; an interconnect section underlying the semiconductor section and selectively connecting ones of the plurality of devices with a plurality of conductive traces; a second layer of insulating material underlying the interconnect section, a bonding layer underlying the second insulating layer and supporting the first and second insulating layers, the interconnect section, and the device regions;

the semiconductor section being formed with a plurality of first trenches between at least certain of the device regions and extending from the IC surface down through the semiconductor section to the first layer of insulating material;

at least one additional trench formed in the IC and arranged to extend down through the semiconductor section and through the underlying first insulating layer to penetrate the interconnect section exposing at least one of the conductive traces of the interconnect section; and a metallization layer overlying a portion of the surface of at least one of the device regions of the semiconductor section.

2. The IC chip according to claim 1 further comprising:

at least one contact opening in the second insulating layer forming a direct contact between the bonding layer and at least one of the conductive traces of the interconnect section.

\* \* \* \* \*